(12) United States Patent
Kim et al.

(10) Patent No.: US 10,310,279 B2
(45) Date of Patent: Jun. 4, 2019

(54) COLOR SPLITTER STRUCTURE, METHOD OF MANUFACTURING THE SAME, IMAGE SENSOR INCLUDING COLOR SPLITTER STRUCTURE, AND OPTICAL APPARATUS INCLUDING IMAGE SENSOR

(71) Applicant: SAMSUNG ELECTRONICS CO., LTD., Suwon-si (KR)

(72) Inventors: Ilhwan Kim, Yongin-si (KR); Doyoon Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 197 days.

(21) Appl. No.: 15/280,273

(22) Filed: Sep. 29, 2016

(65) Prior Publication Data

US 2017/0090206 A1   Mar. 30, 2017

(30) Foreign Application Priority Data

Sep. 30, 2015   (KR) .................. 10-2015-0138008

(51) Int. Cl.
  *G02B 27/10*   (2006.01)
  *H01L 27/146*   (2006.01)
  *H04N 9/097*   (2006.01)

(52) U.S. Cl.
  CPC ..... *G02B 27/1013* (2013.01); *G02B 27/1073* (2013.01); *G02B 27/1086* (2013.01);
  (Continued)

(58) Field of Classification Search
  CPC ............ G02B 27/1013; G02B 27/1073; G02B 27/1086; G02B 27/12; G02B 27/14;
  (Continued)

(56) References Cited

U.S. PATENT DOCUMENTS

| | | | |
|---|---|---|---|
| 3,858,977 A * | 1/1975 | Baird ..................... | G02B 5/285 356/71 |
| 5,294,288 A * | 3/1994 | Melpolder ............ | G02B 5/201 257/E31.123 |

(Continued)

FOREIGN PATENT DOCUMENTS

| | | |
|---|---|---|
| EP | 2955551 A1 | 12/2015 |
| JP | 2011205122 A | 10/2011 |

(Continued)

OTHER PUBLICATIONS

Communication dated Mar. 1, 2017 issued by the European Patent Office in counterpart European Patent Application No. 16191823.0.

(Continued)

*Primary Examiner* — John R Lee
(74) *Attorney, Agent, or Firm* — Sughrue Mion, PLLC

(57) ABSTRACT

Provided are color splitter structures, methods of manufacturing the color splitter structures, image sensors including the color splitter structures, methods of manufacturing the image sensors, and optical apparatuses including the image sensors. A color splitter may include a plurality of color splitter elements configured to divide an incident light into a plurality of exit lights according to wavelengths, and at least one of the color splitter elements may include a first element portion; a second element portion disposed to shift to the first element portion so as to partially overlap with the first element portion; and an etch stop layer provided between the first and second element portions.

15 Claims, 30 Drawing Sheets

(52) U.S. Cl.
CPC .. *H01L 27/14621* (2013.01); *H01L 27/14625* (2013.01); *H01L 27/14627* (2013.01); *H01L 27/14645* (2013.01); *H04N 9/097* (2013.01)

(58) Field of Classification Search
CPC .. G02B 27/142; G02B 27/145; G02B 27/146; G02B 5/201; G02B 5/22; G02B 5/28; G02B 5/286; H04N 9/097; H01L 27/14621; H01L 27/1462; H01L 27/14625; H01L 27/14627; H01L 27/14645; H01L 27/14685
See application file for complete search history.

(56) References Cited

U.S. PATENT DOCUMENTS

| | | | | |
|---|---|---|---|---|
| 5,731,898 | A * | 3/1998 | Orzi | G09F 13/06 |
| | | | | 359/585 |
| 6,692,830 | B2 | 2/2004 | Argoitia | B41M 3/14 |
| | | | | 359/575 |
| 6,879,450 | B2 * | 4/2005 | Edlingger | G02B 5/201 |
| | | | | 359/891 |
| 8,337,988 | B2 * | 12/2012 | Knoll | C03C 17/36 |
| | | | | 428/432 |
| 8,384,818 | B2 | 2/2013 | Hiramoto et al. | |
| 8,400,537 | B2 * | 3/2013 | McCarten | H01L 27/14621 |
| | | | | 348/272 |
| 9,525,006 | B2 * | 12/2016 | Nam | G02B 5/201 |
| 9,591,277 | B2 * | 3/2017 | Park | G02B 5/201 |
| 9,766,467 | B2 * | 9/2017 | Sohn | G02B 27/1013 |
| 9,853,073 | B2 * | 12/2017 | Roh | H01L 27/14621 |
| 9,859,317 | B2 * | 1/2018 | Kim | H01L 51/5268 |
| 9,860,492 | B2 * | 1/2018 | Yun | G02B 5/22 |
| 9,971,160 | B2 * | 5/2018 | Sohn | G02B 27/1013 |
| 10,014,338 | B2 * | 7/2018 | Lee | H01L 27/14621 |
| 2002/0005471 | A1 * | 1/2002 | Suzuki | H01L 27/14625 |
| | | | | 250/208.1 |
| 2008/0068478 | A1 * | 3/2008 | Watanabe | H01L 27/14621 |
| | | | | 348/294 |
| 2009/0316274 | A1 * | 12/2009 | Lee | G02B 5/045 |
| | | | | 359/634 |
| 2010/0019129 | A1 * | 1/2010 | Ishigaki | H01L 27/14621 |
| | | | | 250/208.1 |
| 2010/0097703 | A1 * | 4/2010 | Menon | G02B 3/10 |
| | | | | 359/565 |
| 2010/0176473 | A1 * | 7/2010 | Nishiwaki | H01L 27/14621 |
| | | | | 257/432 |
| 2010/0188537 | A1 * | 7/2010 | Hiramoto | H01L 27/14621 |
| | | | | 348/294 |
| 2011/0085116 | A1 | 4/2011 | Kim | |
| 2011/0192962 | A1 | 8/2011 | Nishiwaki et al. | |
| 2012/0212656 | A1 * | 8/2012 | Hiramoto | H01L 27/14621 |
| | | | | 348/294 |
| 2013/0099343 | A1 * | 4/2013 | Toshikiyo | H01L 27/14625 |
| | | | | 257/432 |
| 2014/0327099 | A1 | 11/2014 | Boudreau et al. | |
| 2014/0333796 | A1 * | 11/2014 | Nishiwaki | H04N 5/2254 |
| | | | | 348/222.1 |
| 2014/0346766 | A1 * | 11/2014 | Walter | G02B 5/286 |
| | | | | 283/81 |
| 2015/0221693 | A1 * | 8/2015 | Saitou | H01L 27/14627 |
| | | | | 257/432 |
| 2015/0318318 | A1 * | 11/2015 | Nam | H01L 27/14603 |
| | | | | 257/432 |
| 2015/0365640 | A1 | 12/2015 | Park et al. | |
| 2016/0054173 | A1 * | 2/2016 | Kim | H01L 27/14685 |
| | | | | 250/208.1 |
| 2016/0064448 | A1 * | 3/2016 | Shin | H01L 27/14645 |
| | | | | 257/292 |
| 2016/0109716 | A1 | 4/2016 | Sohn | |
| 2017/0090206 | A1 * | 3/2017 | Kim | G02B 27/1013 |

FOREIGN PATENT DOCUMENTS

| | | |
|---|---|---|
| JP | 5325117 B2 | 10/2013 |
| KR | 1020070029921 A | 3/2007 |
| KR | 1020150143148 A | 12/2015 |

OTHER PUBLICATIONS

"Efficient colour splitters for high-pixel-density image sensors", Nature Photonics, 2013 (Feb. 3, 2013), vol. 7, Total 13 pages.

* cited by examiner

<COMPARATIVE EXAMPLE>

COLOR SPLITTER STRUCTURE, METHOD OF MANUFACTURING THE SAME, IMAGE SENSOR INCLUDING COLOR SPLITTER STRUCTURE, AND OPTICAL APPARATUS INCLUDING IMAGE SENSOR

CROSS-REFERENCE TO RELATED APPLICATION

This application claims the benefit of Korean Patent Application No. 10-2015-0138008, filed on Sep. 30, 2015, in the Korean Intellectual Property Office, the disclosure of which is incorporated herein in its entirety by reference.

BACKGROUND

1. Field

Apparatuses and methods consistent with exemplary embodiments relate to color splitter structures, methods of manufacturing the color splitter structures, image sensors including the color splitter structures, methods of manufacturing the image sensors, and optical apparatuses including the image sensors.

2. Description of the Related Art

In general, display devices or image sensors display images of various colors or sense the colors of incident lights by using color filters. The display devices or image sensors most widely adopt a red-green-blue (RGB) color filter method in which, for example, a green filter is disposed in two pixels among four pixels and a blue filter and a red filter are disposed in the other two pixels.

However, a color filter may have a low light use efficiency because the color filter absorbs lights of colors other than the target color. For example, when an RGB color filter is used therein, since only about ⅓ of the incident light is transmitted and the other portion, that is, about ⅔ of the incident light is absorbed, the light use efficiency thereof may be as low as about 33%. Thus, in the case of display devices or image sensors, most of the light loss occurs in color filters.

SUMMARY

One or more exemplary embodiments may provide a color splitter structure capable of increasing light use efficiency.

One or more exemplary embodiments may provide a color splitter structure having excellent performance.

One or more exemplary embodiments may provide a color splitter structure capable of improving color separation properties for obliquely incident lights.

One or more exemplary embodiments may provide a method of manufacturing the color splitter structure.

One or more exemplary embodiments may provide an image sensor including the color splitter structure.

One or more exemplary embodiments may provide an optical apparatus including the image sensor.

Additional exemplary aspects will be set forth in part in the description which follows and, in part, will be apparent from the description, or may be learned by practice of the exemplary embodiments.

According to an aspect of an exemplary embodiment, there is provided a color splitter including a plurality of color splitter elements configured to divide an incident light into a plurality of exit lights according to wavelengths, wherein at least one of the color splitter elements may include a first element portion; a second element portion disposed to shift to the first element portion so as to partially overlap with the first element portion; and an etch stop layer provided between the first and second element portions.

The first element portion may have a first surface facing the second element portion, the second element portion may have a second surface facing the first element portion, and the etch stop layer may be provided to correspond to the first surface, and cover a portion of the second surface.

The first element portion may have a first surface facing the second element portion, the second element portion may have a second surface facing the first element portion, and the etch stop layer may be provided to correspond to the second surface, and cover a portion of the first surface.

The etch stop layer may include a material having an etch selectivity of about 1.5 or more with respect to at least one of the first and second element portions.

At least one of the first and second element portions may include an oxide material, and the etch stop layer may include a non-oxide material.

The etch stop layer may include a nitride material, and at least one of the first and second element portions may include a non-nitride material.

At least one of the first and second element portions may include at least one of a titanium (Ti) oxide, a niobium (Nb) oxide, and a tantalum (Ta) oxide, and the etch stop layer may include a silicon (Si) nitride.

At least one of the first and second element portions may include a Si nitride, and the etch stop layer may include a Si oxide.

The color splitter structure may further include a dielectric layer, and the color splitter elements may be buried in the dielectric layer.

The color splitter element disposed at a center portion of the plurality of color splitter elements may include first and second element portions aligned on an optical axis without being shifted each other, and each of the color splitter elements disposed in a region other than the center portion of the plurality of color splitter elements may include first and second element portions shifted each other.

A shift distance between the first element portion and the corresponding second element portion may increase away from the center portion.

The first element portion and the corresponding second element portion disposed in the region other than the center portion may be aligned with a traveling direction of an incident light that is obliquely incident thereon.

At least one of the color splitter elements may further include: a third element portion overlapping partially with the second element portion; and a second etch stop layer provided between the second element portion and the third element portion.

According to an aspect of another exemplary embodiment, there is provided an image sensor including: a color splitter comprising a plurality of color splitter elements configured to divide an incident light into a plurality of exit lights according to wavelengths; and a pixel array including a plurality of pixels configured to detect a light passing out through the color splitter, wherein at least one of the color splitter elements may include a first element portion; a second element portion disposed to shift to the first element portion so as to partially overlap with the first element portion; and an etch stop layer provided between the first and second element portions.

According to an aspect of another exemplary embodiment, there is provided an optical apparatus including: at least one lens; and an image sensor configured to convert lights passing through the at least one lens into electrical image signals and comprise a color splitter comprising a plurality of color splitter elements configured to divide an incident light into a plurality of exit lights according to wavelengths and a pixel array comprising a plurality of pixels configured to detect a light passing out through the color splitter, wherein at least one of the color splitter elements may include a first element portion; a second element portion disposed to shift to the first element portion so as to partially overlap with the first element portion; and an etch stop layer provided between the first and second element portions.

According to an aspect of another exemplary embodiment, there is provided a method of manufacturing a color splitter including a plurality of color splitter elements dividing an incident light into a plurality of exit lights according to wavelengths, the method including: forming, on an understructure, a stack structure having a first element portion and an etch stop layer stacked on the first element portion; forming a dielectric layer on the understructure around the stack structure; forming a color splitter material layer on the stack structure and the dielectric layer; and forming a second element portion by patterning the color splitter material layer to expose a portion of the etch stop layer, wherein the second element portion is formed to partially overlap with the first element portion.

The color splitter material layer may be a second material layer, and the forming of the stack structure may include: forming a first material layer for the color splitter on the understructure; forming an etch stop material layer on the first material layer; and patterning the etch stop material layer and the first material layer sequentially.

At least one of the first and second element portions may include an oxide material, and the etch stop layer may include a nitride material.

At least one of the first and second element portions may include at least one of a titanium (Ti) oxide, a niobium (Nb) oxide, and a tantalum (Ta) oxide, and the etch stop layer may include a silicon (Si) nitride.

When at least one of the first and second element portions includes a Ti oxide, a chlorine (Cl)-containing gas may be used as an etching gas for the Ti oxide, and when the etch stop layer includes a Si nitride, a fluorine (F)-containing gas may be used as an etching gas for the Si nitride.

At least one of the first and second element portions may include a nitride material, and the etch stop layer may include an oxide material.

At least one of the first and second element portions may include a Si nitride, and the etch stop layer may include a Si oxide.

According to an aspect of another exemplary embodiment, there is provided a method of manufacturing an image sensor including: preparing a substrate structure including a pixel array; and forming a color splitter comprising a plurality of color splitter elements dividing an incident light into a plurality of exit lights according to wavelengths on the substrate structure, wherein forming at least one of the color splitter elements includes: forming, on an understructure, a stack structure having a first element portion and an etch stop layer stacked on the first element portion; forming a dielectric layer on the understructure around the stack structure; forming a color splitter material layer on the stack structure and the dielectric layer; and forming a second element portion by patterning the color splitter material layer to expose a portion of the etch stop layer, wherein the second element portion is formed to partially overlap with the first element portion.

According to an aspect of another exemplary embodiment, there is provided a method of manufacturing a color splitter including a plurality of color splitter elements dividing an incident light into a plurality of exit lights according to wavelengths, the method including: forming a first element portion on an understructure; forming a dielectric layer on the understructure around the first element portion; forming an etch stop material layer on the first element portion and the dielectric layer; forming a color splitter material layer on the etch stop material layer; forming a second element portion by patterning the color splitter material layer to expose the etch stop material layer, wherein the second element portion is formed to partially overlap with the first element portion; and patterning the etch stop material layer by using the second element portion as an etching mask.

At least one of the first and second element portions may include an oxide material, and the etch stop material layer may include a nitride material.

At least one of the first and second element portions may include at least one of a titanium (Ti) oxide, a niobium (Nb) oxide, and a tantalum (Ta) oxide, and the etch stop layer may include a silicon (Si) nitride.

When at least one of the first and second element portions includes a Ti oxide, a chlorine (Cl)-containing gas may be used as an etching gas for the Ti oxide, and when the etch stop layer includes a Si nitride, a fluorine (F)-containing gas may be used as an etching gas for the Si nitride.

At least one of the first and second element portions may include a nitride material, and the etch stop layer may include an oxide material.

At least one of the first and second element portions may include a Si nitride, and the etch stop layer may include a Si oxide.

According to an aspect of another exemplary embodiment, there is provided a method of manufacturing an image sensor including: preparing a substrate structure including a pixel array; and forming a color splitter comprising a plurality of color splitter elements dividing an incident light into a plurality of exit lights according to wavelengths on the substrate structure, wherein forming at least one of the color splitter elements including: forming a first element portion on an understructure; forming a dielectric layer on the understructure around the first element portion; forming an etch stop material layer on the first element portion and the dielectric layer; forming a color splitter material layer on the etch stop material layer; forming a second element portion by patterning the color splitter material layer to expose the etch stop material layer, wherein the second element portion is formed to partially overlap with the first element portion; and patterning the etch stop material layer by using the second element portion as an etching mask.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF EXEMPLARY EMBODIMENTS

Figure 1:
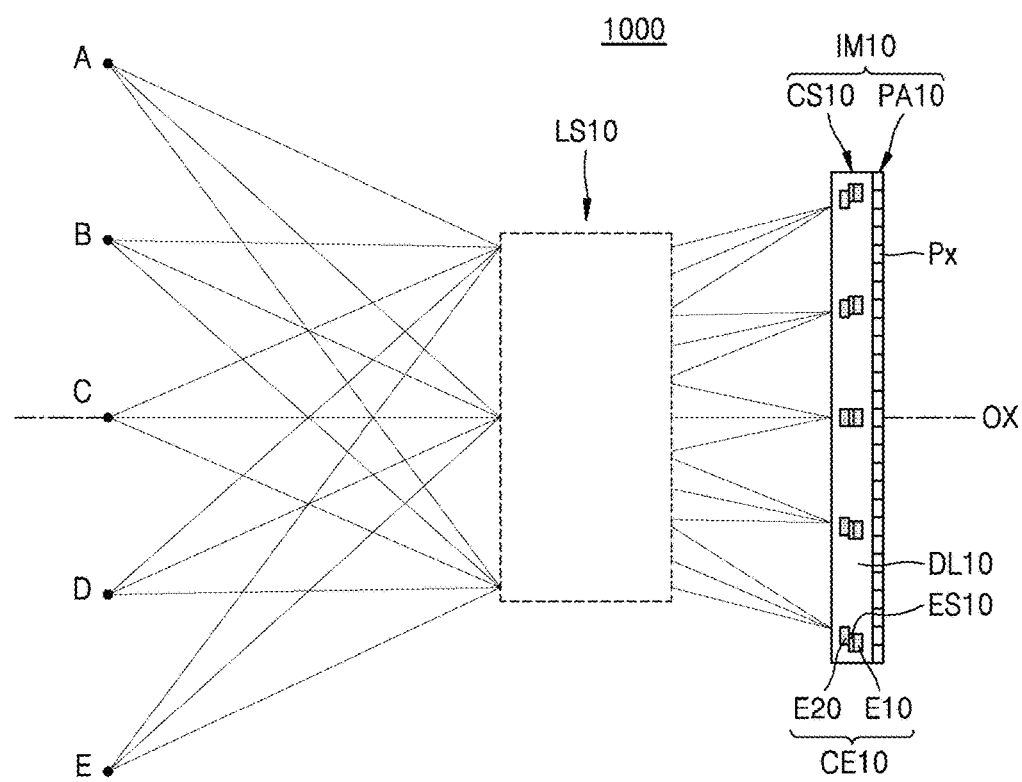
FIG. 1 is a schematic cross-sectional view illustrating an image sensor including a color splitter structure and an optical apparatus including the image sensor according to an exemplary embodiment.

Reference will now be made in detail to exemplary embodiments, examples of which are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Various exemplary embodiments will now be described more fully with reference to the accompanying drawings in which exemplary embodiments are shown. Throughout the drawings, each element may be exaggerated in size for clarity and convenience of explanation. Accordingly, the exemplary embodiments are merely illustrative, and various modifications may be possible from the exemplary embodiments.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items.

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of exemplary embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a", "an", and "the" may include the plural forms as well, unless the context clearly indicates otherwise. It will be further understood that the terms "comprise", "include", and/or "have", when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized embodiments (and intermediate structures) of exemplary embodiments. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, color splitter structures, methods of manufacturing the color splitter structures, image sensors including the color splitter structures, methods of manufacturing the image sensors, and optical apparatuses including the image sensors according to exemplary embodiments will be described in detail with reference to the accompanying drawings. The widths and thicknesses of layers or regions illustrated in the accompanying drawings may be exaggerated for clarity and convenience of description. Like reference numerals may denote like elements throughout the specification. Also, well-known functions or constructions are not described in detail since they would obscure the exemplary embodiments with unnecessary detail.

FIG. 1 is a schematic cross-sectional view illustrating an image sensor IM10 including a color splitter structure CS10 and an optical apparatus 1000 including the image sensor IM10 according to an exemplary embodiment. Herein, the optical apparatus 1000 may be an image pickup apparatus.

Referring to FIG. 1, the optical apparatus 1000 according to an exemplary embodiment may include a lens structure LS10 and the image sensor IM10 for converting lights passing through the lens structure LS10 into electrical image signals. The lens structure LS10 may include at least one lens. The lens structure LS10 may be a lens assembly including a plurality of lenses. The lens structure LS10 may be referred to as an objective lens. Although the lens structure LS10 is illustrated simply, the configuration thereof may be very various. The image sensor IM10 may include a pixel array PA10 having a plurality of pixels Px for sensing lights, and a color splitter structure CS10 having a plurality of color splitter elements CE10. The pixels Px may be arranged two-dimensionally, and the color splitter elements CE10 may also be arranged two-dimensionally. Although only five color splitter elements CE10 are illustrated in FIG. 1, but is not limited thereto, and much more color splitter elements CE10 may be provided therein. The color splitter elements CE10 may constitute a color splitter element array. In other words, the color splitter structure CS10 may include a color splitter element array. The color splitter structure CS10 may further include a transparent dielectric layer DL10 provided on a surface of the pixel array PA10, and the color splitter elements CE10 may be buried in the transparent dielectric layer DL10.

The color splitter elements CE10 may be disposed at a light incidence side of the pixel array PA10 to separate an incident light according to wavelengths such that lights of different wavelengths may be incident on different pixels Px. In other words, each of the color splitter elements CE10 may divide the light (incident light) incident thereon into a plurality of exit lights according to the wavelengths, and the exit lights may be irradiated to the pixels Px. The color splitter element CE10 may separate the colors by changing the traveling path of the light according to the wavelength of the incident light by using the diffraction or refraction property of the light that varies according to the wavelengths thereof. By using the color splitter elements CE10, the light use efficiency may be increased by optimizing the spectrum distribution of the light incident on the respective pixels Px. The positional relationship between the color splitter elements CE10 and the pixels Px of the image sensor IM10 may be variously designed according to the color separation properties of the color splitter elements CE10.

Each of the color splitter elements CE10 may include a plurality of element portions, for example, a first element portion E10 and a second element portion E20, disposed between the incidence surface and the exit surface thereof. In this case, each of the color splitter elements CE10 may further include an etch stop layer ES10 provided between the first element portion E10 and the second element portion E20. The first element portion E10 may be disposed on the exit surface side, and the second element portion E20 may be disposed on the incidence surface side. In other words, the first element portion E10 and the second element portion E20 may be disposed sequentially in the direction from the exit surface to the incidence surface corresponding thereto. The relative positional relationship between the first element portion E10 and the second element portion E20 and the function of the etch stop layer ES10 will be described later in more detail.

The lens structure LS10 may focus an image of an object on the image sensor IM10. The light starting from at a certain point of the object may be focused on a certain point on the image sensor IM10 through the lens structure LS10. For example, the light starting from a certain point C on an optical axis OX may pass through the lens structure LS10 and arrive at the center of the image sensor IM10 on the optical axis OX. Also, the light starting from any one of points A, B, D, and E located out of the optical axis OX may travel across the optical axis OX by the lens structure LS10 and arrive at a point in the region other than the center of the image sensor IM10. For example, the light starting from the point A located above the optical axis OX may travel across the optical axis OX and arrive at the lower edge of the image sensor IM10, and the light starting from the point E located below the optical axis OX may travel across the optical axis OX and arrive at the upper edge of the image sensor IM10. The light starting from the point B located between the optical axis OX and the point A may arrive at a position between the lower edge and the center of the image sensor IM10, and the light starting from the point D located between the optical axis OX and the point E may arrive at a position between the upper edge and the center of the image sensor IM10.

Thus, the lights starting from the different points A, B, C, D, and E may be incident on the image sensor IM10 at different incidence angles according to the distances between the optical axis OX and the points A, B, C, D, and E. The incidence angle of the light incident on the image sensor IM10 may be defined as a chief ray angle (CRA). The chief ray may represent a ray that starts from a point of the object, passes through the center of the lens structure LS10 (or the portion adjacent to the center), and arrives at the image sensor IM10. The CRA may represent an angle formed by the chief ray with respect to the optical axis OX. The CRA of the light starting from the point C on the optical axis OX may be 0°, and the light may be perpendicularly incident on the image sensor IM10. The CRA may increase as the starting point is farther from the optical axis OX.

From the viewpoint of the image sensor IM10, the CRA of the light incident on the center portion of the image sensor IM10 may be 0°, and the CRA of the incident light may increase gradually toward the edge of the image sensor IM10. For example, the CRA of the lights starting from the points A and E and arriving at the both edges of the image sensor IM10 may be the largest, and the CRA of the light starting from the point C and arriving at the center portion of the image sensor IM10 may be 0°. The CRA of the light starting from the point B and arriving at a position between the center and the lower edge of the image sensor IM10 may be greater than 0° and smaller than the CRA of the lights starting from the points A and E. Similarly, the CRA of the light starting from the point D and arriving at a position between the center and the upper edge of the image sensor IM10 may be greater than 0° and smaller than the CRA of the lights starting from the points A and E. The light paths illustrated in FIG. 1 are merely exemplary, and the light paths may vary according to the configurations of the lens structure LS10.

The color splitter structure CS10 according to the exemplary embodiment may include the color splitter elements CE10 configured to perform efficient color separation even at the edge of the image sensor IM10 as well as at the center portion thereof. Each of the color splitter elements CE10 may include a plurality of element portions, for example, the first element portion E10 and the second element portion E20, which are arranged sequentially in the direction from the exit surface thereof to the incidence surface corresponding thereto. The first element portion E10 and the second element portion E20 of the color splitter elements CE10 may be shifted by different degrees according to the positions of the color splitter elements CE10 in the image sensor IM10. For example, the first element portion E10 and the second element portion E20 of the color splitter element CE10 disposed at the center portion of the image sensor IM10 may be aligned on the optical axis OX such that the first element portion E10 and the second element portion E20 are not shifted each other. The first element portion E10 and the second element portion E20 of the color splitter elements CE10 disposed in the region other than the center portion of the image sensor IM10 may be shifted each other. For example, the degree of shift between the first element portion E10 and the second element portion E20 may increase as the distance from the center portion of the image sensor IM10 increases. The first element portion E10 and the second element portion E20 of the color splitter element CE10 disposed at the outermost edge of the image sensor IM10 may be shifted to the greatest extent. The etch stop layer ES10 may be disposed between the first element portion E10 and the second element portion E20. The etch stop layer ES10 may protect the first element portion E10 from being damaged in the process of forming the second element portion E20 shifted to the first element portion E10. The etch stop layer ES10 may facilitate the adjustment of the distance between the first element portion E10 and the second element portion E20 corresponding thereto. Also, the etch stop layer ES10 may improve the color separation property of each color splitter element CE10.

When each of the color splitter elements is formed in one united body and the color splitter elements have the same directivity, for example, the directivity parallel to the optical axis OX, the color splitter elements may efficiently operate with respect to the lights perpendicularly incident on the color splitter elements. However, when the incidence angle increases over a certain angle, the color separation efficiency of the color splitter elements may be drastically lowered. Thus, when the color splitter elements having the same structure are arranged in the entire region of the image sensor IM10, the quality of an image may be more degraded as the distance from the center portion of the image sensor IM10 increases. However, according to the exemplary embodiment, since each of the color splitter elements CE10 includes the plurality of element portions E10 and E20 and the degree of shift of the element portions E10 and E20 r in each color splitter element CE10 is adjusted according to the position of the color splitter element CE10 in the image sensor IM10, the optimal color separation property may be secured for each position of the image sensor IM10.

Figure 2A:
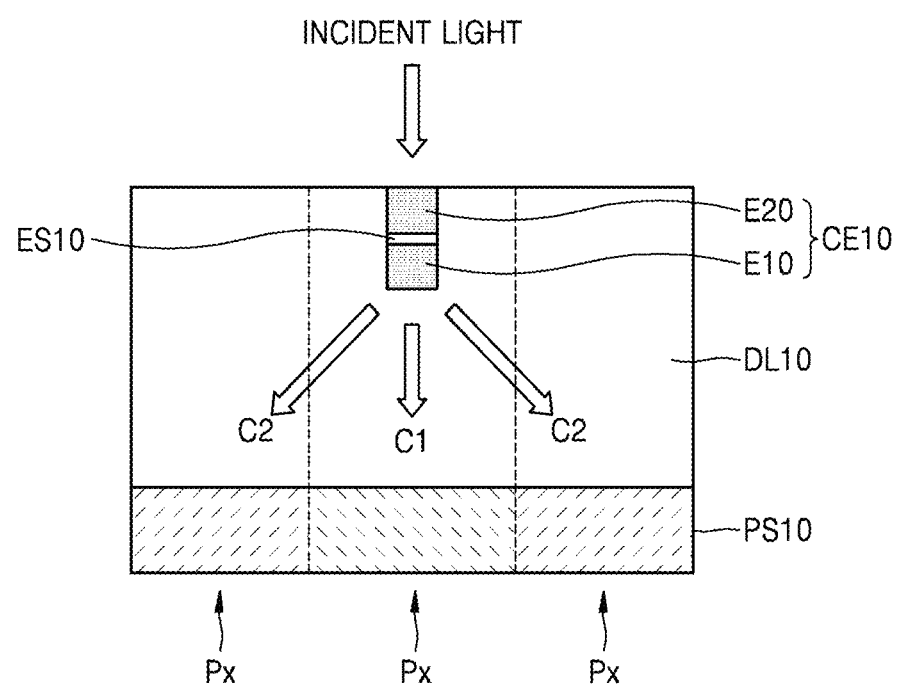
FIG. 2A is a cross-sectional view illustrating a detailed positional relationship between a first element portion and a second element portion of a color splitter element according to an exemplary embodiment when a light is perpendicularly incident on an image sensor.
Figure 2B:
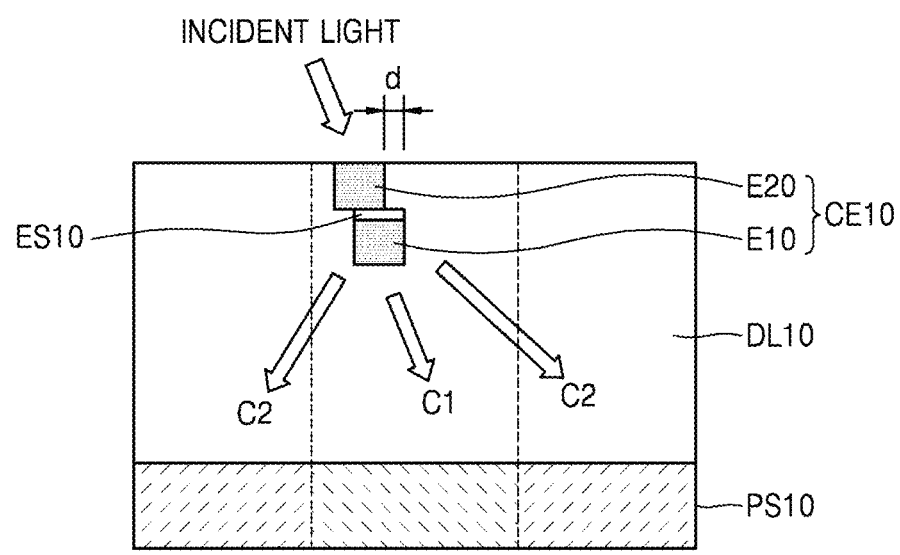
FIG. 2B is a cross-sectional view illustrating a detailed positional relationship between a first element portion and a second element portion of a color splitter element according to another exemplary embodiment when a light is obliquely incident on an image sensor.
Figure 2C:
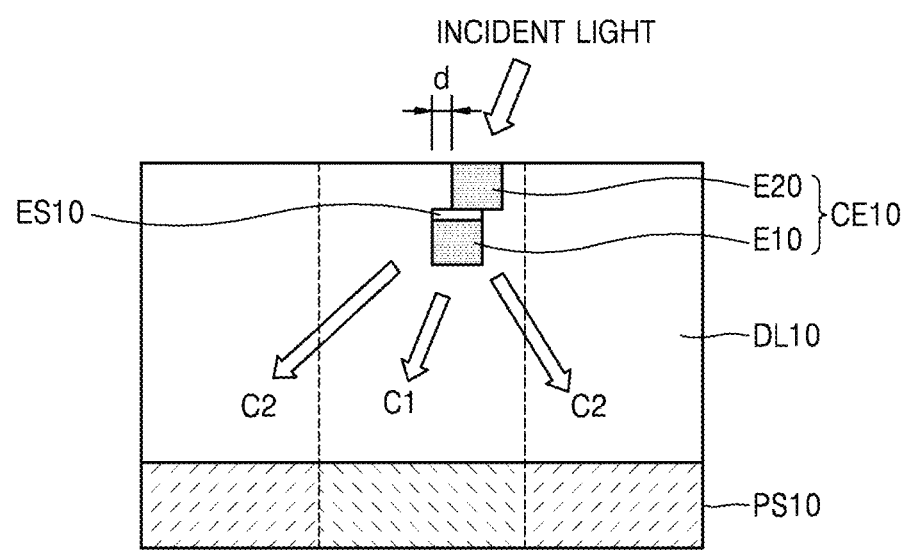
FIG. 2C is a cross-sectional view illustrating a detailed positional relationship between a first element portion and a second element portion of a color splitter element according to another exemplary embodiment when a light is obliquely incident on an image sensor.

FIG. 2A is a cross-sectional view illustrating the detailed positional relationship between the first element portion E10 and the second element portion E20 of the color splitter element CE10 when a light (incident light) is perpendicularly incident on the image sensor IM10 (see FIG. 1). FIGS. 2B and 2C are cross-sectional views illustrating the detailed positional relationship between the first element portion E10 and the second element portion E20 of the color splitter element CE10 when a light (incident light) is obliquely incident on the image sensor IM10.

Referring to FIG. 2A, the transparent dielectric layer DL10 may be provided on a photosensor device portion PS10 divided into a plurality of pixel (Px) regions, and the color splitter element CE10 may be provided in the transparent dielectric layer DL10. Herein, the photosensor device portion PS10 may correspond to the pixel array PA10 of FIG. 1. The incident light may be separated into a light C1 of a first wavelength band and a light C2 of a second wavelength band by the color splitter element CE10. The color splitter element CE10 may be designed to change the traveling direction of the light C2 of the second wavelength band obliquely to both sides without changing the traveling direction of the light C1 of the first wavelength band among the incident light. The light C1 of the first wavelength band may be incident on the photosensor device portion PS10 of the pixel (Px) region located directly under the color splitter element CE10 after passing through the color splitter element CE10. The light C2 of the second wavelength band may be incident on the photosensor device portion PS10 of the pixel (Px) regions located on both sides of the color splitter element CE10 after passing through the color splitter element CE10.

As illustrated in FIG. 2A, when the incident light is perpendicularly incident on the image sensor IM10 (see FIG. 1), the first element portion E10 and the second element portion E20 of the color splitter element CE10 may not be shifted each other. In this case, the center portions of the first element portion E10 and the second element portion E20 may be aligned along the center line of the corresponding pixel (Px) region. The color splitter element CE10 may be disposed at the center portion of the image sensor IM10 (see FIG. 1).

Referring to FIGS. 2B and 2C, when the incident light is obliquely incident on the image sensor IM10 (see FIG. 1), the first element portion E10 and the second element portion E20 of the color splitter element CE10 may be shifted each other. The first element portion E10 and the second element portion E20 of the color splitter elements CE10 may be shifted to align with the traveling direction of the obliquely-incident light. For example, as illustrated in FIG. 2B, when the incident light is obliquely incident from the left side, the second element portion E20 may be relatively further shifted to the left in comparison with the first element portion E10. Also, as illustrated in FIG. 2C, when the incident light is obliquely incident from the right side, the second element portion E20 may be relatively further shifted to the right in comparison with the first element portion E10. A relative shift distance "d" of the first element portion E10 and the second element portion E20 may increase as the angle of the incident light (i.e., the incidence angle) increases, that is, the CRA increases. The angle of the straight line connecting the center portions of the first element portion E10 and the second element portion E20 may be equal to or similar to the angle of the incident light (i.e., the incidence angle).

Figure 3:
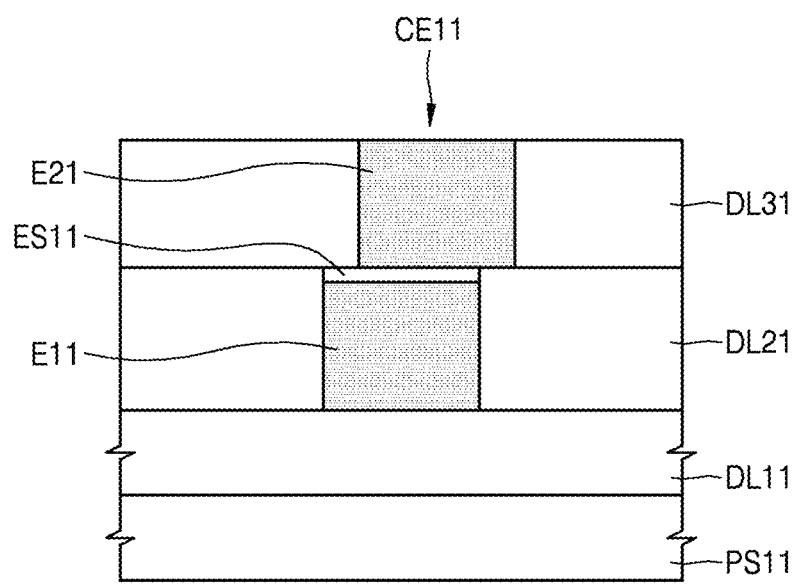
FIG. 3 is a cross-sectional view illustrating a color splitter structure and an image sensor including the same according to an exemplary embodiment.
Figure 4:
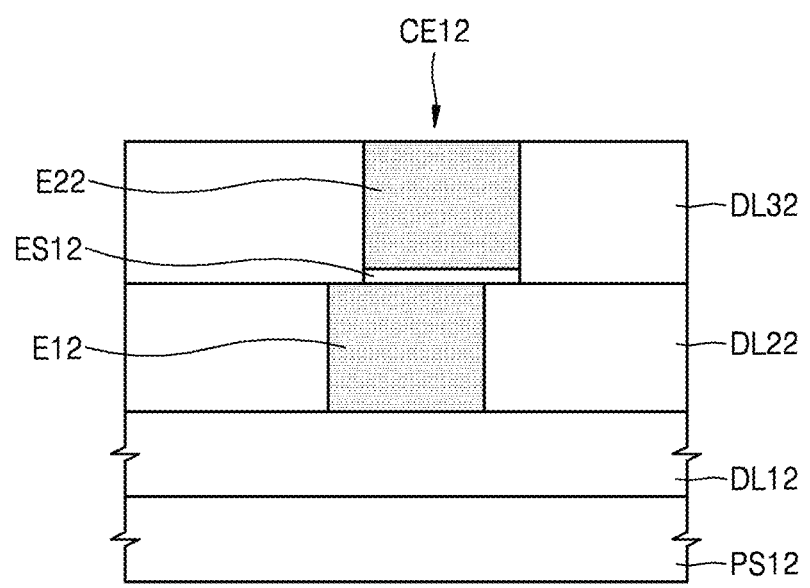
FIG. 4 is a cross-sectional view illustrating a color splitter structure and an image sensor including the same according to another exemplary embodiment.

The position of the etch stop layer ES10 in the color splitter element CE10 may vary according to exemplary embodiments. FIGS. 3 and 4 are cross-sectional views illustrating the structures of color splitter elements CE11 and CE12 according to exemplary embodiments.

FIG. 3 is a cross-sectional view illustrating a color splitter structure and an image sensor including the same according to an exemplary embodiment.

Referring to FIG. 3, a photosensor device portion PS11 may be prepared. Although not illustrated in FIG. 3, the photosensor device portion PS11 may be divided into a plurality of pixel regions. The photosensor device portion PS11 may be a substrate structure including a pixel array. A first dielectric layer DL11 may be provided on the photosensor device portion PS11. A first element portion E11 may be provided on the first dielectric layer DL11. A second element portion E21 may be disposed on the first element portion E11 to shift to the first element portion E11 to partially overlap with the first element portion E11. An etch stop layer ES11 may be provided between the first element portion E11 and the second element portion E21. The first element portion E11, the etch stop layer ES11, and the second element portion E21 may constitute a color splitter element CE11.

The first element portion E11 may have a first surface (top surface) facing the second element portion E21, and the second element portion E21 may have a second surface (bottom surface) facing the first element portion E11. The etch stop layer ES11 may be disposed between the first surface and the second surface. The etch stop layer ES11 may be provided to correspond to the first surface, that is, the top surface of the first element portion E11. A portion of the second surface, that is, a portion of the bottom surface of the second element portion E21 may not be covered by the etch stop layer ES11. Also, a portion of the etch stop layer ES11 may not be covered by the second element portion E21.

A second dielectric layer DL21 may be provided on the first dielectric layer DL11 to bury the first element portion E11 and the etch stop layer ES11 therein. The height of the top surface of the second dielectric layer DL21 may be similar to or correspond to the height of the top surface of the etch stop layer ES11. A third dielectric layer DL31 may be provided on the second dielectric layer DL21 to bury the second element portion E21 therein. The height of the top surface of the third dielectric layer DL31 may be similar to or correspond to the height of the top surface of the second element portion E21. The first to third dielectric layers DL11, DL21, and DL31 may constitute a dielectric layer. The first to third dielectric layers DL11, DL21, and DL31 may be a transparent dielectric layer.

FIG. 4 is a cross-sectional view illustrating a color splitter structure and an image sensor including the same according to another exemplary embodiment.

Referring to FIG. 4, a first dielectric layer DL12 may be provided on a photosensor device portion PS12, and a first element portion E12 may be provided on the first dielectric layer DL12. A second element portion E22 may be disposed on the first element portion E12 to partially overlap with the first element portion E12. An etch stop layer ES12 may be provided between the first element portion E12 and the second element portion E22. The first element portion E12, the etch stop layer ES12, and the second element portion E22 may constitute a color splitter element CE12.

The first element portion E12 may have a first surface (top surface) facing the second element portion E22, and the second element portion E22 may have a second surface (bottom surface) facing the first element portion E12. The etch stop layer ES12 may be disposed between the first surface and the second surface. The etch stop layer ES12 may be provided to correspond to the second surface, that is, the bottom surface of the second element portion E22. A portion of the first surface, that is, a portion of the top surface of the first element portion E12 may not be covered by the etch stop layer ES12. Also, a portion of the etch stop layer ES11 may not be covered by the first element portion E12.

A second dielectric layer DL22 may be provided on the first dielectric layer DL12 to bury the first element portion E12 therein. The height of the top surface of the second dielectric layer DL22 may be similar to or correspond to the height of the top surface of the first element portion E12. A third dielectric layer DL32 may be provided on the second dielectric layer DL22 to bury the etch stop layer ES12 and the second element portion E22 therein. The height of the top surface of the third dielectric layer DL32 may be similar to or correspond to the height of the top surface of the second element portion E22. The first to third dielectric layers DL12, DL22, and DL32 may be a transparent dielectric layer.

In FIGS. 3 and 4, the etch stop layers ES11 and ES12 may be formed of a material having an etch selectivity of about 1.5 or more or about 3 or more with respect to at least one of the first element portions E11 and E12 and the second element portions E21 and E22. For example, in FIG. 3, the etch stop layer ES11 may be formed of a material having an etch selectivity of about 1.5 or more or about 3 or more with respect to the second element portion E21; and in FIG. 4, the etch stop layer ES12 may be formed of a material having an etch selectivity of about 1.5 or more or about 3 or more with respect to the first element portion E12. In FIG. 3, the first and second element portions E11 and E21 may be formed of the same material or different materials. Similarly, in FIG. 4, the first and second element portions E12 and E22 may be formed of the same material or different materials.

The first element portions E11 and E12 and the second element portions E21 and E22 of the color splitter elements CE11 and CE12 may be formed of a material having a relatively high refractive index, for example, a material having a refractive index of about 2 or more. The dielectric layers DL11 to DL31 and DL12 to DL32 may be formed of a material having a relatively low refractive index, for example, a material having a refractive index of less than about 2 or less than about 1.5. For example, the first element portions E11 and E12 and the second element portions E21 and E22 may include an oxide such as a Ti oxide (e.g., $TiO_2$), a Nb oxide (e.g., $Nb_2O_5$), or a Ta oxide (e.g., $Ta_2O_5$), or may include a nitride such as a Si nitride (e.g., $Si_3N_4$ or $SiN_3$). As another example, the first element portions E11 and E12 and the second element portions E21 and E22 may include a compound such as ZnS or ZnSe. The dielectric layers DL11 to DL31 and DL12 to DL32 may be formed of, for example, $SiO_2$ or siloxane-based spin-on-glass (SOG) materials. However, the above described materials are merely exemplary, and various other materials may also be used. The first element portions E11 and E12 and the second element portions E21 and E22 may be formed of the same material having the same refractive index or different materials having different refractive indexes.

When the first element portions E11 and E12 and the second element portions E21 and E22 include an oxide such as a Ti oxide (e.g., $TiO_2$), a Nb oxide (e.g., $Nb_2O_5$), or a Ta oxide (e.g., $Ta_2O_5$), the etch stop layers ES11 and ES12 may include a non-oxide material. For example, the etch stop layers ES11 and ES12 may include a Si nitride (e.g., $Si_3N_4$). In other words, when the etch stop layers ES11 and ES12 include a nitride such as a Si nitride (e.g., $Si_3N_4$), the first element portions E11 and E12 and the second element portions E21 and E22 may include a non-nitride material. The non-nitride material may include, for example, a Ti oxide (e.g., $TiO_2$), a Nb oxide (e.g., $Nb_2O_5$), and/or a Ta oxide (e.g., $Ta_2O_5$). The etch selectivity between the oxide (e.g., $TiO_2$, $Nb_2O_5$, or $Ta_2O_5$) and the nitride (e.g., $Si_3N_4$) may be about 1.5 or more or about 3 or more. When the first element portions E11 and E12 and the second element portions E21 and E22 include a nitride such as a Si nitride (e.g., $Si_3N_4$ or $SiN_3$), the etch stop layers ES11 and ES12 may include a non-nitride material. For example, the etch stop layers ES11 and ES12 may include an oxide such as a Si oxide (e.g., $SiO_2$). The etch selectivity between the nitride (e.g., $Si_3N_4$ or $SiN_3$) and the oxide (e.g., $SiO_2$) may be about 1.5 or more or about 3 or more.

The thickness of the etch stop layers ES11 and ES12 may be determined according to the over-etch degree, the etch selectivity, and the thickness of the first element portions E11 and E12 and the second element portions E21 and E22. For example, the thickness of the etch stop layers ES11 and ES12 may be determined to be about 50 nm or less. The thickness of each of the first element portions E11 and E12 and the second element portions E21 and E22 may be about several tens of nm to about several hundreds of nm. Also, the width of each of the first element portions E11 and E12 and the second element portions E21 and E22 may be about several tens of nm to about several hundreds of nm, and the shift distance between the first element portions E11 and E12 and the second element portions E21 and E22 may be determined to be smaller than the width of each of them.

As illustrated in FIGS. 3 and 4, when the color splitter elements CE11 and CE12 include the etch stop layers ES11 and ED12, the damage of the first element portions E11 and E12 may be suppressed in the process of forming the second element portions E21 and E22, the distance between the first element portions E11 and E12 and the second element portions E21 and E22 may be easily controlled, and the improved color separation property thereof may be easily secured.

Figure 5:
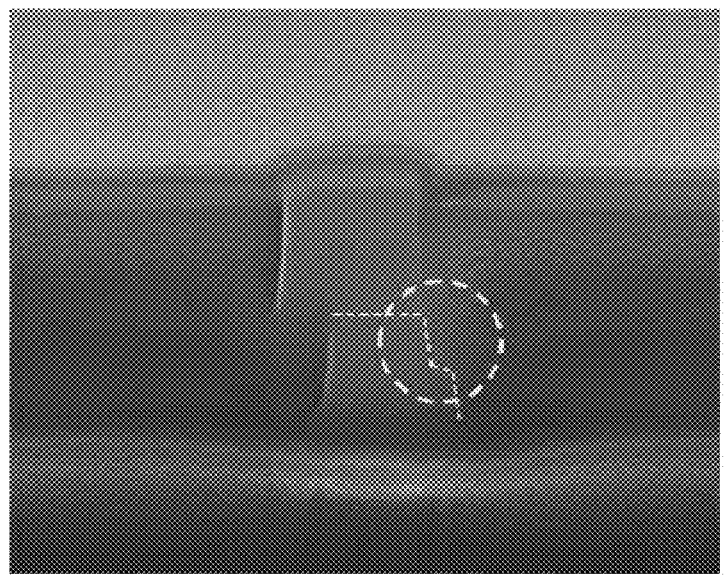
FIG. 5 is a scanning electron microscope (SEM) cross-sectional picture illustrating the problem of a color splitter element formed without an etch stop layer according to a comparative example.

FIG. 5 is a scanning electron microscope (SEM) cross-sectional picture illustrating the problem of a color splitter element formed without an etch stop layer according to a comparative example.

Referring to FIG. 5, when a color splitter element is formed without an etch stop layer, a portion of the bottom element portion may be undesirably etched and damaged in an etching process for forming the top element portion. In consideration of the etching non-uniformity in the entire substrate (wafer), the top element portion may need to be over-etched by about 10% to about 30% in comparison with the designed thickness of the top element portion in the process of forming the top element portion, and thus the bottom element portion may be easily damaged. This problem may be worsened toward the edge side away from the center portion of the image sensor IM10 (see FIG. 1). That is, the shift degree between the two element portions may increase toward the edge side away from the center portion of the image sensor IM10 (see FIG. 1), and the damage degree of the bottom element portion may increase as the shift degree therebetween increases. However, according to an exemplary embodiment, since an etch stop layer is disposed between a plurality of element portions (top and bottom element portions), the problem illustrated in FIG. 5 may be prevented and a color splitter element having an originally-designed shape may be easily implemented. The etch stop layer may control the distance between the element portions (top and bottom element portions) and improve the color separation property of the color splitter element.

FIGS. 6A to 6G are cross-sectional views illustrating a method of manufacturing a color splitter structure according to an exemplary embodiment.

Figure 6A:
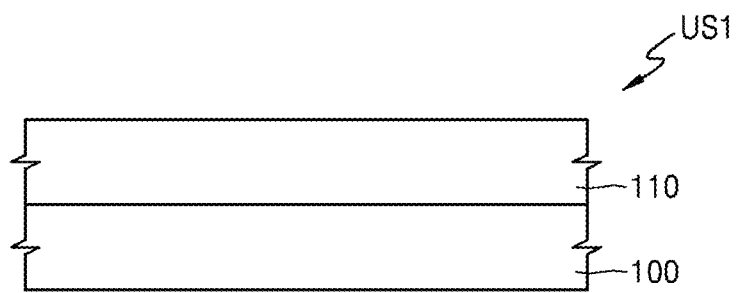
FIGS. 6A to 6G are cross-sectional views illustrating a method of manufacturing a color splitter structure according to an exemplary embodiment.

Referring to FIG. 6A, an understructure US1 may be prepared. The understructure US1 may include a photosensor device portion 100 and a first dielectric layer 110 formed on the photosensor device portion 100.

Figure 6B:
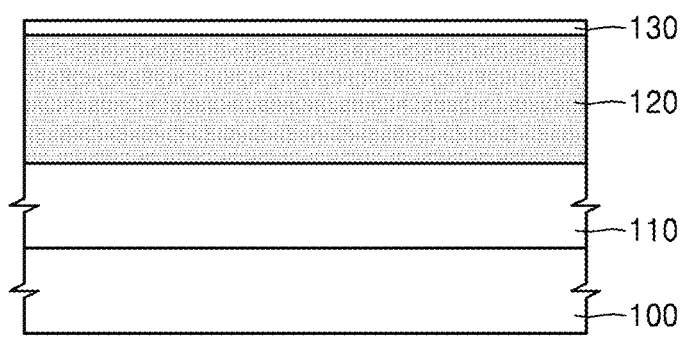

Referring to FIG. 6B, a first material layer 120 for a color splitter may be formed on the first dielectric layer 110. Thereafter, an etch stop material layer 130 may be formed on the first material layer 120 for a color splitter. The materials of the first material layer 120 may be identical to or similar to the materials of the first element portions E11 and E12 described with reference to FIGS. 3 and 4. The materials of the etch stop material layer 130 may be identical to or similar to the materials of the etch stop layers ES11 and ES12 described with reference to FIGS. 3 and 4. For example, the first material layer 120 may include an oxide such as a Ti oxide (e.g., $TiO_2$), a Nb oxide (e.g., $Nb_2O_5$), or a Ta oxide (e.g., $Ta_2O_5$), or may include a nitride such as a Si nitride (e.g., $Si_3N_4$ or $SiN_3$). As another example, the first material layer 120 may include a compound such as ZnS or ZnSe. The etch stop material layer 130 may be formed of a material having an etch selectivity of about 1.5 or more or about 3 or more with respect to the first material layer 120. When the first material layer 120 includes an oxide such as a Ti oxide (e.g., $TiO_2$), a Nb oxide (e.g., $Nb_2O_5$), or a Ta oxide (e.g., $Ta_2O_5$), the etch stop material layer 130 may include a non-oxide material such as a Si nitride (e.g., $Si_3N_4$). When the first material layer 120 includes a nitride such as a Si nitride (e.g., $Si_3N_4$ or $SiN_3$), the etch stop material layer 130 may include a non-nitride material such as a Si oxide (e.g., $SiO_2$). The material of the first material layer 120 and the material of the etch stop material layer 130 may be replaced with each other. The materials of the first material layer 120 and the etch stop material layer 130 are not limited thereto and may be variously modified.

Figure 6C:
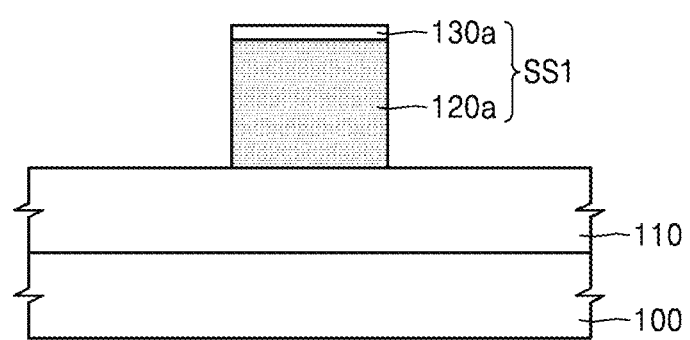

Referring to FIG. 6C, the etch stop material layer 130 and the first material layer 120 may be sequentially patterned to form a first element portion 120a and an etch stop layer 130a. An etching mask (not illustrated) may be formed on the etch stop material layer 130 to form the etch stop layer 130a and the first element portion 120a. The etch stop layer 130a may be provided on the top surface of the first element portion 120a. The first element portion 120a and the etch stop layer 130a may constitute a stack structure SS1.

When the etch stop material layer 130 includes a nitride, a fluorine (F)-containing gas may be used as an etching gas in a patterning process for forming the etch stop layer 130a. For example, when the etch stop material layer 130 includes a Si nitride (e.g., $Si_3N_4$), an etching gas for etching this may include $CF_4$ and $O_2$ or may include $CF_4$, $CHF_3$, and $O_2$. This etching gas may have a high etch selectivity with respect to only the etch stop material layer 130 and may little affect the first material layer 120. When the etch stop material layer 130 includes a Si oxide (e.g., $SiO_2$), an etching gas for etching this may include, for example, $C_4F_6$, Ar, and $O_2$.

When the first material layer 120 includes an oxide, a chlorine (Cl)-containing gas may be used as an etching gas in a patterning process for forming the first element portion 120a. For example, when the first material layer 120 includes a Ti oxide (e.g., $TiO_2$), an etching gas for etching this may include $BCl_3$ and Ar or may include $BCl_3$ and He. The etching gas for etching the first material layer 120 including a Ti oxide (e.g., $TiO_2$) may include $BCl_3$, Ar, and $O_2$ or may include $BCl_3$, He, and $O_2$. For example, the etching gas for etching the first material layer 120 including a Ti oxide (e.g., $TiO_2$) may include $BCl_3$ and $C_2H_4$ or may include $Cl_2$ and Ar. This etching gas may have a high etch selectivity with respect to only the first material layer 120 and may little affect the etch stop material layer 130.

When the first material layer 120 includes a Nb oxide (e.g., $Nb_2O_5$), an etching gas for etching this may include $CF_4$ and $O_2$ or may include $CF_4$ and $H_2$. When the first material layer 120 includes a Ta oxide (e.g., $Ta_2O_5$), an etching gas for etching this may include $CF_4$, $CF_3Cl$, or $CHF_3$, $CF_4$, and Ar. When the first material layer 120 includes a Si nitride (e.g., $Si_3N_4$ or $SiN_3$), an etching gas for etching this may include $CF_4$ and $O_2$ or may include $CF_4$, $CHF_3$, and $O_2$.

Figure 6D:
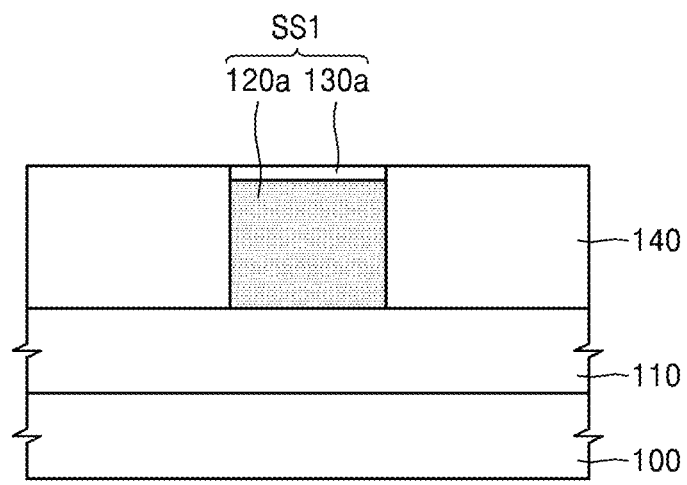

Referring to FIG. 6D, a second dielectric layer 140 may be formed on the first dielectric layer 110 around the stack structure SS1. The height of the top surface of the second dielectric layer 140 may be equal to or similar to the height of the top surface of the etch stop layer 130a. For example, a dielectric material layer may be formed on the first dielectric layer 110 to cover the stack structure SS1 and a planarization process and/or an etch-back process may be performed on the dielectric material layer to form the second dielectric layer 140.

Figure 6E:
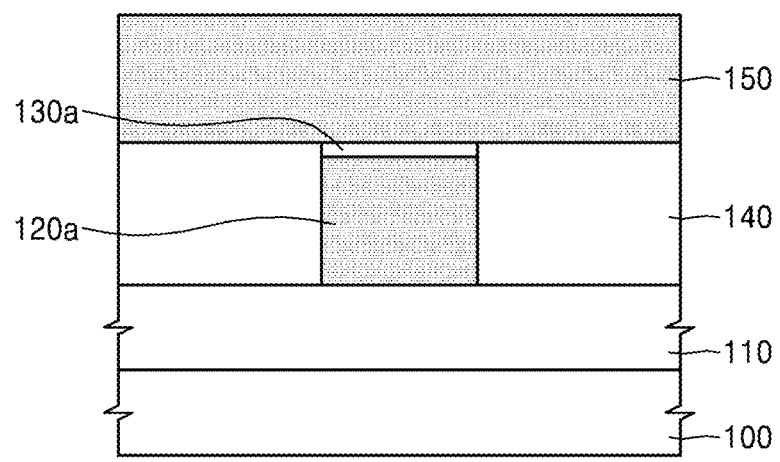

Referring to FIG. 6E, a second material layer 150 for a color splitter may be formed on the etch stop layer 130a and the second dielectric layer 140. The material of the second material layer 150 may be identical to or different from the material of the first material layer 120. For example, the second material layer 150 may include an oxide such as a Ti oxide (e.g., $TiO_2$), a Nb oxide (e.g., $Nb_2O_5$), or a Ta oxide (e.g., $Ta_2O_5$), a nitride such as a Si nitride (e.g., $Si_3N_4$ or $SiN_3$), or a compound such as ZnS or ZnSe.

Figure 6F:
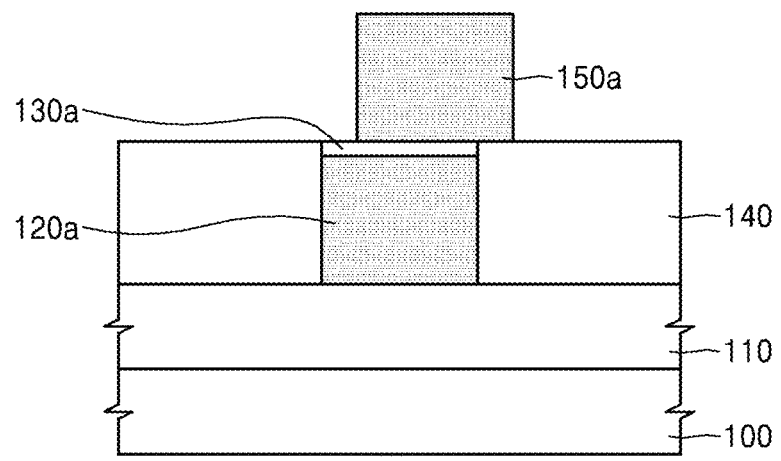

Referring to FIG. 6F, an etching mask (not illustrated) may be formed on the second material layer 150 and a portion of the second material layer 150 not covered by the etching mask may be etched. In other words, the second material layer 150 may be patterned in a certain form. In this case, the second material layer 150 may be patterned to expose a portion of the etch stop layer 130a. As a result, a second element portion 150a may be patterned and formed from the second material layer 150. The second element portion 150a may be formed to partially overlap with the first element portion 120a.

By the etch stop layer 130a, the first element portion 120a may be protected without being damaged in the process of etching the second material layer 150. When the second material layer 150 includes an oxide, a chlorine (Cl)-containing gas may be used as an etching gas in a patterning process for forming the second element portion 150a. When the second material layer 150 includes a Ti oxide (e.g., $TiO_2$), an etching gas for etching this may include $BCl_3$ and Ar or may include $BCl_3$ and He. Alternatively, the etching gas may include $BCl_3$, Ar, and $O_2$ or include $BCl_3$, He, and $O_2$. Alternatively, the etching gas may include $BCl_3$ and $C_2H_4$ or include $Cl_2$ and Ar.

When the second material layer 150 includes a Nb oxide (e.g., $Nb_2O_5$), an etching gas for etching this may include $CF_4$ and $O_2$ or may include $CF_4$ and $H_2$. When the second material layer 150 includes a Ta oxide (e.g., $Ta_2O_5$), an etching gas for etching this may include $CF_4$, $CF_3Cl$, or $CHF_3$, $CF_4$, and Ar. When the second material layer 150 includes a Si nitride (e.g., $Si_3N_4$ or $SiN_3$), an etching gas for etching this may include $CF_4$ and $O_2$ or may include $CF_4$, $CHF_3$, and $O_2$.

The etching gas for etching the second material layer 150 may have a high etch selectivity with respect to only the second material layer 150 and may little affect the etch stop layer 130a. Even when the etching gas for etching the second material layer 150 and the etching gas for etching the etch stop material layer 130 (see FIG. 6B) include a similar series of gas, the etch selectivity may increase according to the type of accompanying gas and other etching conditions. Thus, the first element portion 120a may be protected without being damaged in the process of forming the second element portion 150a by etching the second material layer 150. Also, by the etch stop layer 130a, the distance between the first element portion 120a and the second element portion 150a may be controlled uniformly or almost uniformly in the entire region of the substrate (wafer).

Figure 6G:
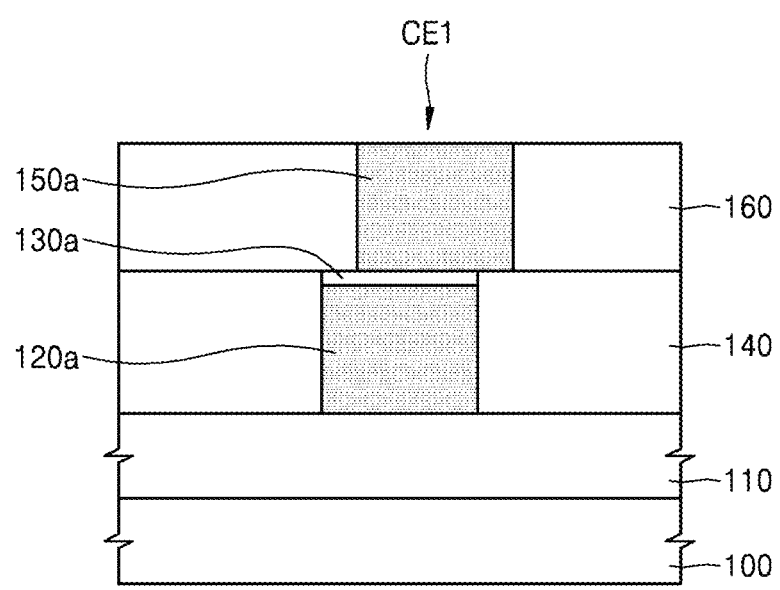

Referring to FIG. 6G, a third dielectric layer 160 may be formed on the second dielectric layer 140 around the second element portion 150a. The height of the top surface of the third dielectric layer 160 may be equal to or similar to the height of the top surface of the second element portion 150a. A dielectric material layer may be formed on the second dielectric layer 140 to cover the second element portion 150a and a planarization process and/or an etch-back process may be performed on the dielectric material layer to form the third dielectric layer 160. The first element portion 120a, the second element portion 150a, and the etch stop layer 130a provided therebetween may constitute a color splitter element CE1. The color splitter element CE1 may correspond to the color splitter element CE11 of FIG. 3.

FIGS. 7A to 7H are cross-sectional views illustrating a method of manufacturing a color splitter structure according to another exemplary embodiment.

Figure 7A:
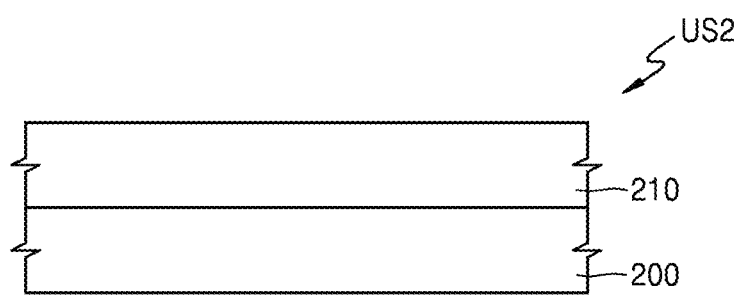
FIGS. 7A to 7H are cross-sectional views illustrating a method of manufacturing a color splitter structure according to another exemplary embodiment.

Referring to FIG. 7A, an understructure US2 may be prepared. The understructure US2 may include a photosensor device portion 200 and a first dielectric layer 210 formed on the photosensor device portion 200.

Figure 7B:
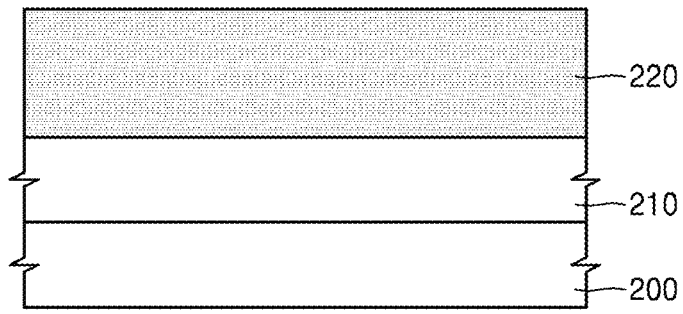

Referring to FIG. 7B, a first material layer 220 for a color splitter may be formed on the first dielectric layer 210. The material of the first material layer 220 for a color splitter may be identical to or similar to the material of the first material layer 120 of FIG. 6B.

Figure 7C:
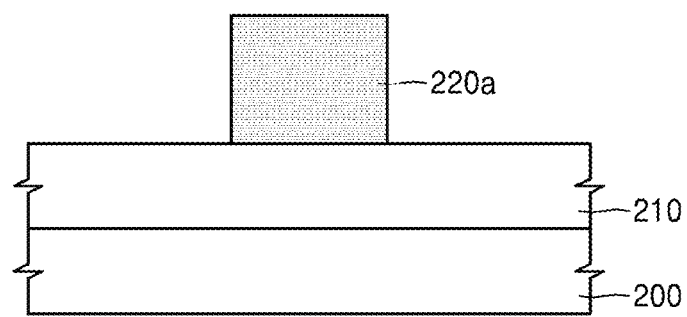

Referring to FIG. 7C, the first material layer 220 may be patterned to form a first element portion 220a. The first element portion 220a may be similar to or correspond to the first element portion 120a of FIG. 6C. An etching gas used in the process of patterning the first material layer 220 may be identical to or similar to the etching gas used in the process of patterning the first material layer 120 of FIG. 6B.

Figure 7D:
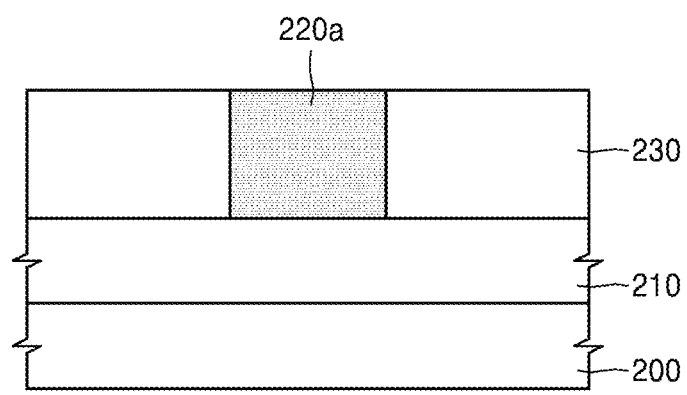

Referring to FIG. 7D, a second dielectric layer 230 may be formed on the first dielectric layer 210 around the first element portion 220a.

Figure 7E:
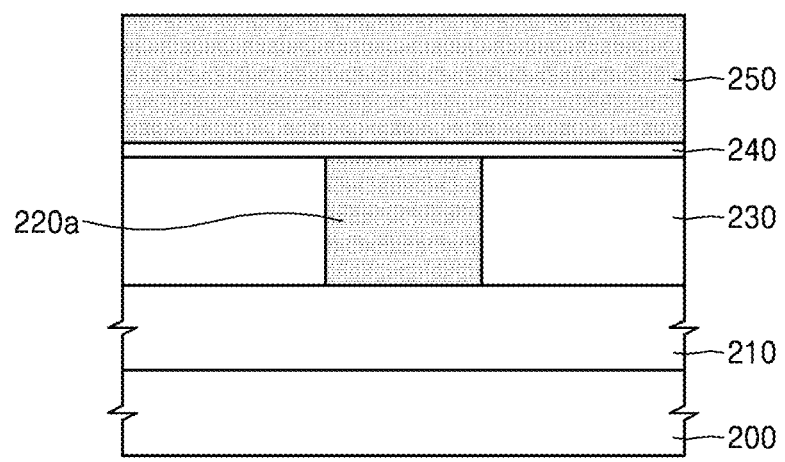

Referring to FIG. 7E, an etch stop material layer 240 may be formed on the first element portion 220a and the second dielectric layer 230, and a second material layer 250 for a color splitter may be formed on the etch stop material layer 240. The material of the etch stop material layer 240 may be identical to or similar to the material of the etch stop material layer 130 of FIG. 6B, and the material of the second material layer 250 may be identical to or similar to the material of the second material layer 150 of FIG. 6E.

Figure 7F:
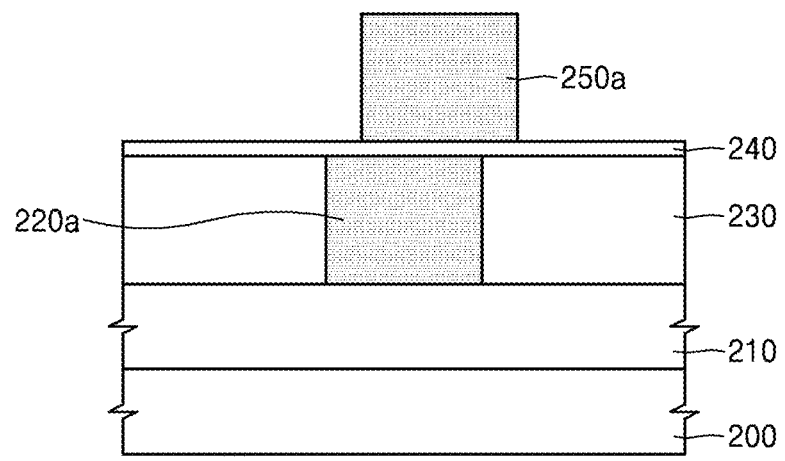

Referring to FIG. 7F, the second material layer 250 may be patterned to expose the etch stop material layer 240 to form a second element portion 250a. The second element portion 250a may be formed to partially overlap with the first element portion 220a. An etching gas used in the process of patterning the second material layer 250 may be identical to or similar to the etching gas used in the process of patterning the second material layer 150 of FIG. 6E.

Figure 7G:
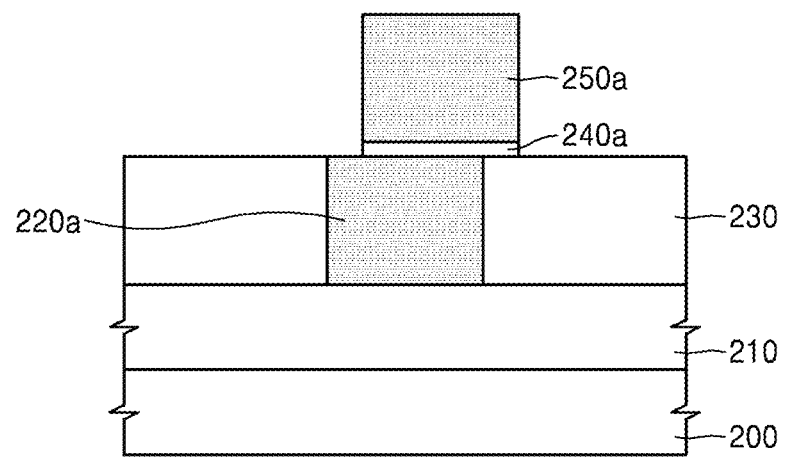

Referring to FIG. 7G, by using the second element portion 250a as an etching mask, the etch stop material layer 240 may be etched to form an etch stop layer 240a under the second element portion 250a. Since the etch selectivity between the etch stop material layer 240 and the first element portion 220a is high, even when the etch stop material layer 240 is etched to expose a portion of the first element portion 220a, the first element portion 220a may be little damaged. Also, since the etch selectivity between the etch stop material layer 240 and the second dielectric layer (planarization layer) 230 may be high, the second dielectric layer (planarization layer) 230 may be protected without being a little damaged in the process of forming the etch stop layer 240a. That is, the etch stop material layer 240 may protect the first element portion 220a and the second dielectric layer (planarization layer) 230. An etching gas for patterning the etch stop material layer 240 may be identical to or similar to the etching gas for patterning the etch stop material layer 130 of FIG. 6B.

Figure 7H:
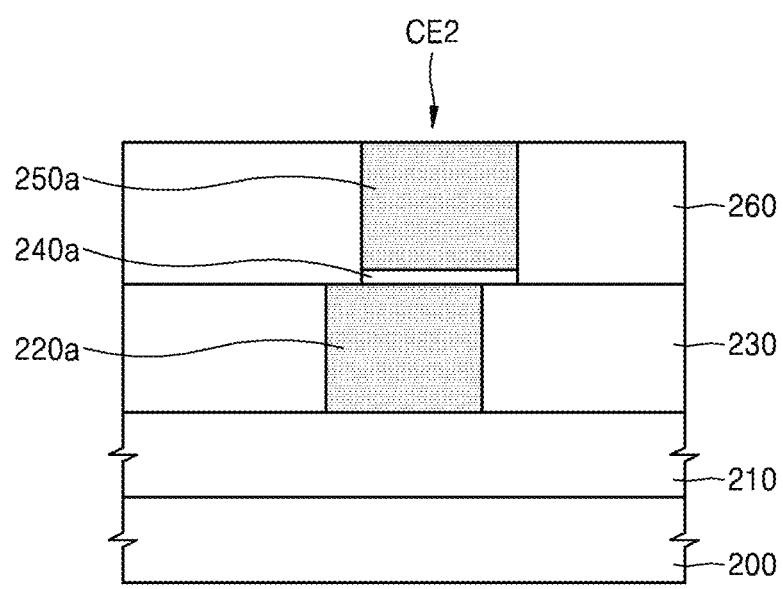

Referring to FIG. 7H, a third dielectric layer 260 may be formed on the second dielectric layer 230 around the second element portion 250a. The height of the top surface of the third dielectric layer 260 may be equal to or similar to the height of the top surface of the second element portion 250a. The first element portion 220a, the second element portion 250a, and the etch stop layer 240a provided therebetween may constitute a color splitter element CE2. The color splitter element CE2 may correspond to the color splitter element CE12 of FIG. 4.

Although the above exemplary embodiments illustrate the case in which one color splitter element includes two element portions, one color splitter element may include three or more element portions. An example thereof is illustrated in FIGS. 8A and 8B.

Figure 8A:
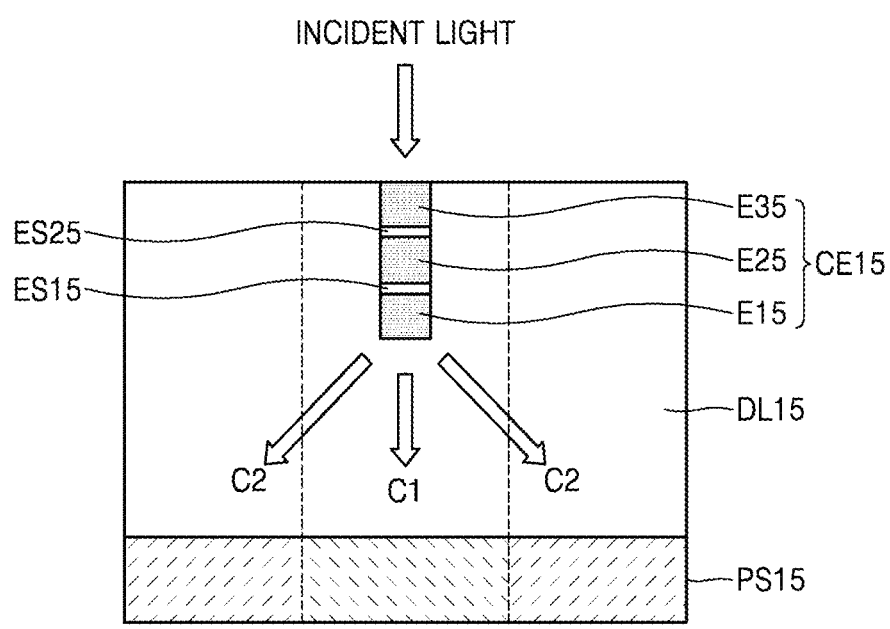
FIGS. 8A and 8B are cross-sectional views illustrating a color splitter structure according to another exemplary embodiment.
Figure 8B:
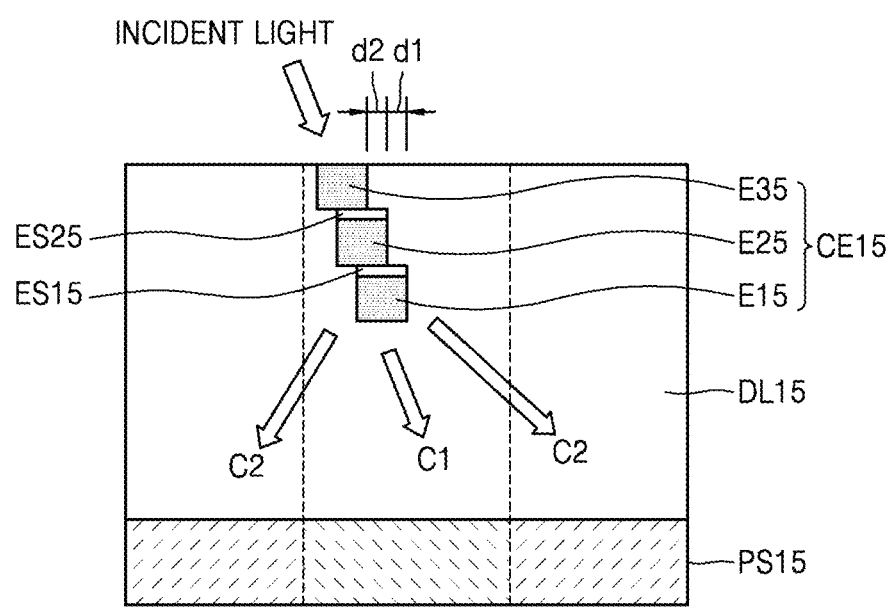

Referring to FIGS. 8A and 8B, a color splitter element CE15 may include a first element portion E15, a second element portion E25, and a third element portion E35. The first element portion E15, the second element portion E25, and the third element portion E35 may be arranged sequentially from the exit surface to the incidence surface. A first etch stop layer ES15 may be provided between the first element portion E15 and the second element portion E25, and a second etch stop layer ES25 may be provided between the second element portion E25 and the third element portion E35. The second element portion E25 may be provided to partially overlap with the first element portion E15, and the third element portion E35 may be provided to partially overlap with the second element portion E25.

As illustrated in FIG. 8A, when the incident light is perpendicularly incident, the center portions of the first to third element portions E15, E25, and E35 may be aligned along the center line of the corresponding pixel region.

As illustrated in FIG. 8B, when the incident light is obliquely incident, the first to third element portions E15, E25, and E35 may be shifted each other. The angle of the straight line connecting the center of the first element portion E15, the center of the second element portion E25, and the center of the third element portion E35 may be equal to or similar to the angle of the incident light. Also, a relative shift distance (first shift distance) "d1" between the first element portion E15 and the second element portion E25 and a relative shift distance (second shift distance) "d2" between the second element portion E25 and the third element portion E35 may be equal to or different from each other. The first shift distance "d1" and the second shift distance "d2" may be selected variously according to the angle of the incident light and the wavelength band of the light to be separated. Also, the distance between the first element portion E15 and the second element portion E25 and the distance between the second element portion E25 and the third element portion E35 may be equal to or different from each other. That is, the thickness of the first etch stop layer ES15 and the thickness of the second etch stop layer ES25 may be equal to or different from each other.

FIG. 8B illustrates the case in which the first and second etch stop layers ES15 and ES25 are provided to correspond respectively to the top surface of the first element portion ES15 and the top surface of the second element portion E25. However, according to another exemplary embodiment, the first and second etch stop layers ES15 and ES25 may be provided to correspond respectively to the bottom surface of the second element portion ES25 and the bottom surface of the third element portion E35. In other words, the color splitter structure of FIG. 8B may have a structure corresponding to FIG. 3 or 4 or a modified structure thereof while having three element portions E15, E25, and E35.

Although FIGS. 8A and 8B illustrate the case in which the color splitter element CE15 has three element portions E15, E25, and E35, the color splitter element may include four or more element portions that are arranged sequentially in the traveling direction of the incident light. In FIGS. 8A and 8B, reference numerals PS15 and DL15 denote a photosensor device portion and a transparent dielectric layer, respectively.

The above exemplary embodiments illustrate the case in which the etch stop layer is provided between the two adjacent element portions having similar materials. However, according to another exemplary embodiment, the two adjacent element portions may be formed of different materials having a high etch selectivity, and the etch stop layer may not be formed in this case. This will be described below with reference to FIGS. 9 and 10.

Figure 9:
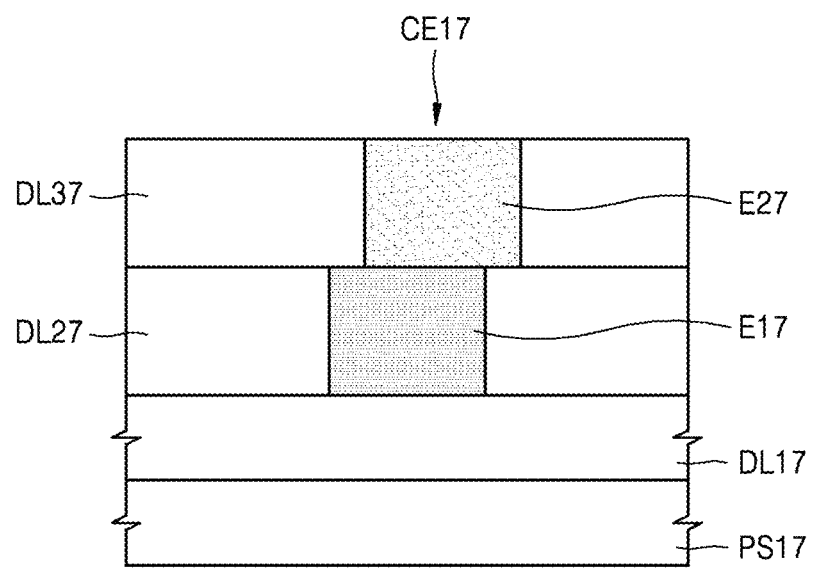
FIG. 9 is a cross-sectional view illustrating a color splitter structure and an image sensor including the same according to another exemplary embodiment.

FIG. 9 is a cross-sectional view illustrating a color splitter structure and an image sensor including the same according to another exemplary embodiment.

Referring to FIG. 9, a color splitter element CE17 may include a first element portion E17 and a second element portion E27. The first element portion E17 and the second element portion E27 may contact each other. The first element portion E17 and the second element portion E27 may be formed of different materials. The etch selectivity between the material of the first element portion E17 and the material of the second element portion E27 may be about 1.5 or more. For example, the etching selectivity between the two materials may be about 3 or more or about 5 or more. In this case, the first element portion E17 may be little damaged in the process of forming the second element portion E27.

For example, the first element portion E17 may be formed of an oxide such as a Ti oxide (e.g., $TiO_2$), a Nb oxide (e.g., $Nb_2O_5$), or a Ta oxide (e.g., $Ta_2O_5$), and the second element portion E27 may be formed of a non-oxide material. The non-oxide material may include, for example, a nitride such as a Si nitride (e.g., $Si_3N_4$ or $SiN_3$). Alternatively, the first element portion E17 may be formed of a nitride such as a Si nitride (e.g., $Si_3N_4$ or $SiN_3$), and the second element portion E27 may be formed of a non-nitride material. The non-nitride material may include an oxide such as a Ti oxide (e.g., $TiO_2$), a Nb oxide (e.g., $Nb_2O_5$), or a Ta oxide (e.g., $Ta_2O_5$). Alternatively, when the first element portion E17 is formed of an oxide such as a Ti oxide (e.g., $TiO_2$), a Nb oxide (e.g., $Nb_2O_5$), or a Ta oxide (e.g., $Ta_2O_5$), the second element portion E27 may be formed of at least one selected from the group consisting of $Si_3N_4$, $SiN_3$, ZnS, and ZnSe. Alternatively, when the first element portion E17 is formed of a nitride such as a Si nitride (e.g., $Si_3N_4$ or $SiN_3$), the second element portion E27 may be formed of at least one selected from the group consisting of $TiO_2$, $Nb_2O_5$, $Ta_2O_5$, ZnS, and ZnSe. Alternatively, the first element portion E17 may be formed of a nitride such as a Si nitride (e.g., $Si_3N_4$ or $SiN_3$) and the second element portion E27 may be formed of an oxide such as a Si oxide (e.g., $SiO_2$), or vice versa. However, the above materials are merely exemplary, and various other materials may also be used.

According to the exemplary embodiment of FIG. 9, when the first and second element portions E17 and E27 are formed of different materials without using an etch stop layer, the manufacturing process thereof may be simplified. In FIG. 9, reference numerals PS17, DL17, DL27, and DL37 denote a photosensor device portion, a first dielectric layer, a second dielectric layer, and a third dielectric layer, respectively.

Figure 10:
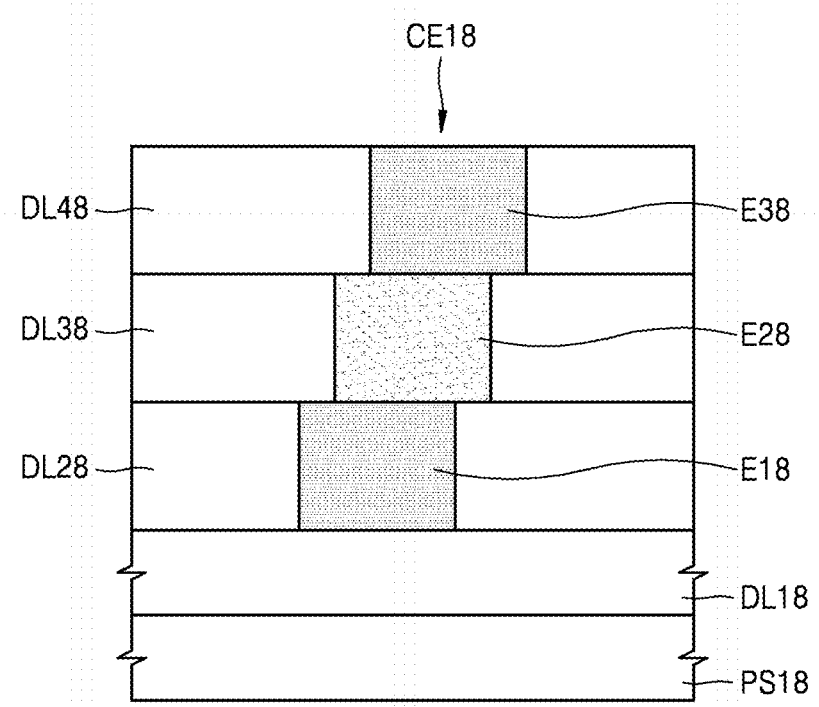
FIG. 10 is a cross-sectional view illustrating a color splitter structure and an image sensor including the same according to another exemplary embodiment.

FIG. 10 is a cross-sectional view illustrating a color splitter structure and an image sensor including the same according to another exemplary embodiment.

Referring to FIG. 10, a color splitter element CE18 may include a first element portion E18, a second element portion E28, and a third element portion E38. The first element portion E18 and the second element portion E28 may contact each other, and the second element portion E28 and the third element portion E38 may contact each other. The first element portion E18 and the second element portion E28 may be formed of different materials, and the second element portion E28 and the third element portion E38 may be formed of different materials. The first element portion E18 and the third element portion E38 may be formed of the same material. In this case, the first element portion E18 and the third element portion E38 may be formed of a first material, and the second element portion E28 may be formed of a second material different from the first material. The first element portion E18 and/or the third element portion E38 may be formed of a material identical to or similar to the material of the first element portion E17 described with reference to FIG. 9. The second element portion E28 may be formed of a material identical to or similar to the material of the second element portion E27 described with reference to FIG. 9. In some cases, all of the first to third element portions E18, E28, and E38 may be formed of different materials.

The etch selectivity between the first element portion E18 and the second element portion E28 may be about 1.5 or more, and the etch selectivity between the second element portion E28 and the third element portion E38 may also be about 1.5 or more. For example, the etch selectivity between the first element portion E18 and the second element portion E28 may be about 3 or more or about 5 or more, and the etch selectivity between the second element portion E28 and the third element portion E38 may also be about 3 or more or about 5 or more. In FIG. 10, reference numerals PS18, DL18, DL28, DL38, and DL48 denote a photosensor device portion, a first dielectric layer, a second dielectric layer, a third dielectric layer, and a fourth dielectric layer, respectively.

Figure 11:
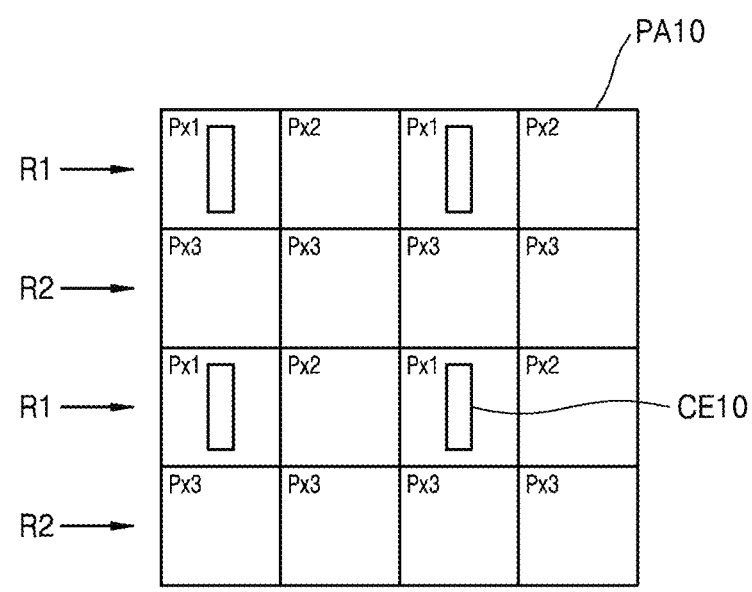
FIG. 11 is a plan view illustrating a positional relationship between color splitter elements and pixels of the image sensor of FIG. 1.

FIG. 11 is a plan view illustrating the positional relationship between the color splitter elements CE10 and the pixels of the image sensor IM10 of FIG. 1.

Referring to FIG. 11, the image sensor IM10 may include the pixel array PA10 having a plurality of photodetector pixels Px1, Px2, and Px3 arranged in the form of a two-dimensional (2D) matrix having a plurality of rows and columns. For example, the first pixels Px1 and the second pixels Px2 may be alternately arranged in a first row R1, and only the third pixels Px3 may be arranged in a second row R2 that is adjacent to the first row R1. The first and second rows R1 and R2 may be alternately arranged in the vertical direction. The color splitter elements CE10 may be disposed to respectively face the first pixels Px1 in the first row R1.

Figure 12:
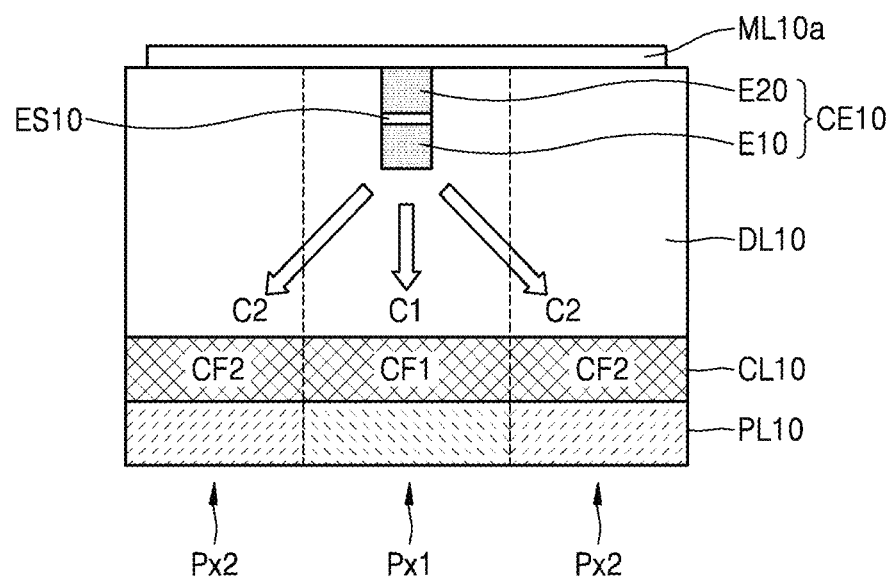
FIG. 12 is a cross-sectional view illustrating the structure of first and second pixels disposed in a first row of the image sensor illustrated in FIG. 11.

FIG. 12 is a cross-sectional view illustrating the structure of the first and second pixels Px1 and Px2 disposed in the first row R1 of the image sensor IM10 illustrated in FIG. 11.

Referring to FIG. 12, the first row R1 may include a light sensing layer PL10, a color filter layer CL10 disposed on the light incidence surface of the light sensing layer PL10, a transparent dielectric layer DL10 disposed over the color filter layer CL10, a color splitter element CE10 provided in the transparent dielectric layer DL10 of the first pixel Px1, and a microlens ML10a disposed on the transparent dielectric layer DL10 to focus the incident light on the color splitter element CE10. The light sensing layer PL10 may convert the incident light into an electrical signal according to the intensity thereof. The color filter layer CL10 may include a first color filter CF1 that is disposed in the first pixel Px1 to transmit only a light in a first wavelength band and a second color filter CF2 disposed in the second pixel Px2 to transmit only a light in a second wavelength band. Although the microlens ML10a is illustrated as covering the first pixel Px1 and the second pixels Px2 located on both sides thereof, it may be separately provided to correspond to the respective pixel regions (Px1 and Px2). Also, although the microlens ML10a is illustrated simply, it may have a certain lens shape.

In the above structure, while passing through the color splitter element CE10, the light focused by the microlens ML10a may be separated into a light C1 of a first wavelength band and a light C2 of a second wavelength band by the color splitter element CE10. For example, the color splitter element CE10 may be designed to change the traveling direction of the light C2 of the second wavelength band obliquely to both sides without changing the traveling direction of the light C1 of the first wavelength band among the incident light. Then, the light C1 of the first wavelength band may be incident on the light sensing layer PL10 of the first pixel Px1 located directly under the color splitter element CE10 after passing through the color splitter element CE10. The light C2 of the second wavelength band may be incident on the light sensing layer PL10 of the second pixels Px2 located on both sides of the first pixel Px1 after passing through the color splitter element CE10.

Figure 13:
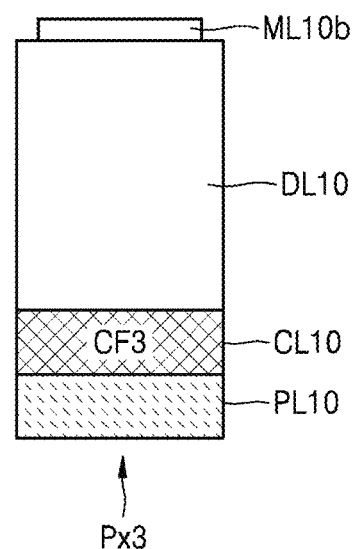
FIG. 13 is a cross-sectional view illustrating the structure of a third pixel disposed in a second row of the image sensor illustrated in FIG. 11.

FIG. 13 is a cross-sectional view illustrating the structure of the third pixel Px3 disposed in the second row R2 of the image sensor IM10 illustrated in FIG. 11.

Referring to FIG. 13, the third pixel Px3 may include a light sensing layer PL10, a color filter layer CL10 disposed on the light incidence surface of the light sensing layer PL10, a transparent dielectric layer DL10 disposed over the color filter layer CL10, and a microlens ML10b disposed on the transparent dielectric layer DL10 to focus the incident light on the light sensing layer PL10. In this structure, by the microlens ML10b, the incident light may be focused on the light sensing layer PL10 after passing through the transparent dielectric layer DL10 and the color filter layer CL10. The color filter layer CL10 may include a third color filter CF3 for transmitting only a light of a third wavelength band among the incident light. Thus, the third pixel Px3 may detect only the light of the third wavelength band.

In the example illustrated in FIGS. 11 to 13, in the third color filter CF3 of the third pixel Px1, only about 33% of the incident light may be transmitted and arrived at the light sensing layer PL10 in a pixel structure of the related art. On the other hand, in the first color filter CF1 of the first pixel Px1 and the second color filter CF2 of the second pixel Px2, since the ratio of the color corresponding to each of the color filters CF1 and CF2 is high, the light transmittance thereof may increase in comparison with the pixel structure of the related art. Thus, the light use efficiency in the first pixel Px1 and the second pixel Px2 may increase. For example, the first wavelength band may be blue, the second wavelength band may be red, and the third wavelength band may be green. In other words, the first pixel Px1 may be a blue pixel, the second pixel Px2 may be a red pixel, and the third pixel Px3 may be a green pixel.

The structure of the pixel array PA10 of the image sensor IM10 and the property of the color filter element CE10 illustrated in FIGS. 11 to 13 are a mere example, and not limited thereto. Various color separation properties may be selected according to the designs of the color splitter elements CE10, and various structures of the pixel array PA10 may be selected according to the color separation properties of the color filter elements CE10. Also, some or all of the microlenses ML10a and ML10b and the color filters CF1, CF2, and CF3 may be omitted according to the designs.

Figure 14:
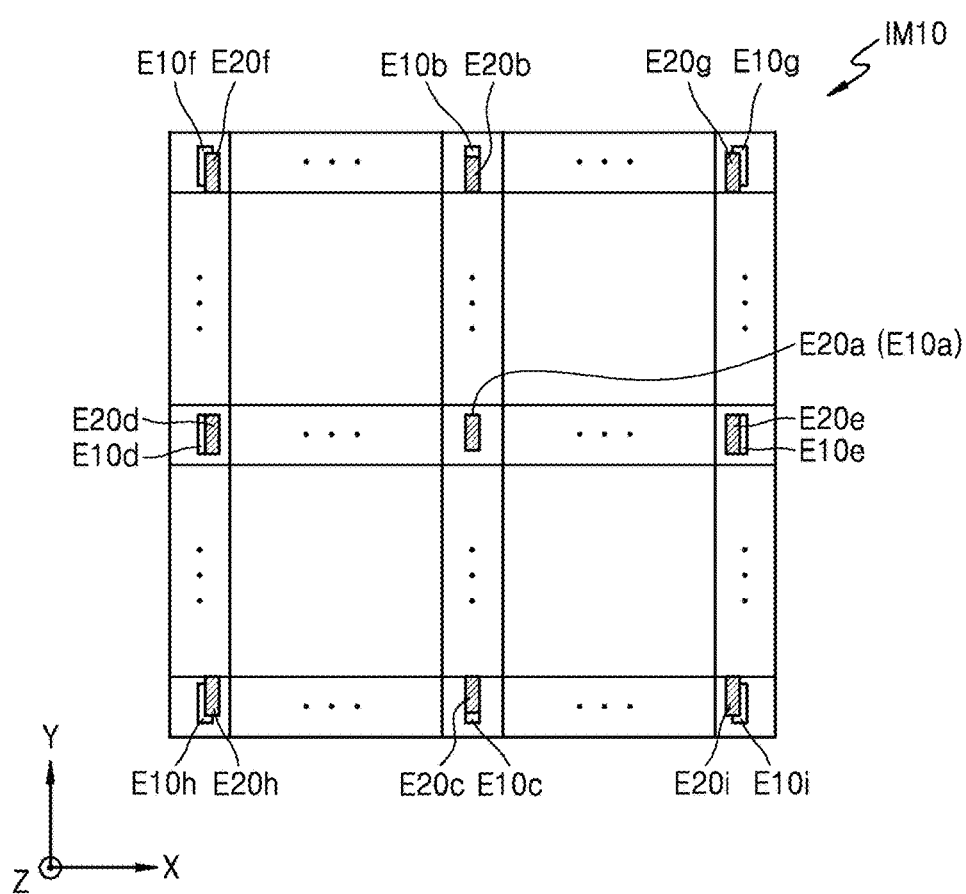
FIG. 14 is a plan view illustrating the shift forms of first element portions and second element portions according to the positions of color splitter elements in the image sensor.

FIG. 14 is a plan view illustrating the shift forms of first element portions E10a, E10b, E10c, E10d, E10e, E10f, E10g, E10h, and E10i and second element portions E20a, E20b, E20c, E20d, E20e, E20f, E20g, E20h, and E20i according to the positions of color splitter elements in the image sensor IM10.

Referring to FIG. 14, a first element portion E10a and a second element portion E20a of the color splitter element are disposed to overlap with each other at the center portion of the image sensor IM10. Thus, only the second element portion E20a may be seen, whereas the first element portion E10a covered by the second element portion E20a may not be seen. Also, first element portions E10b, E10c, E10d, E10e, E10f, E10g, E10h, and E10i and second element portions E20b, E20c, E20d, E20e, E20f, E20g, E20h, and E20i of the color splitter elements located at the peripheral portion of the image sensor IM10 may be shifted each other in a direction X and a direction Y. Since a z-axis in FIG. 14 is the same direction as the optical axis OX (see FIG. 1), the first element portions E10b, E10c, E10d, E10e, E10f, E10g, E10h, and E10i and the second element portions E20b, E20c, E20d, E20e, E20f, E20g, E20h, and E20i may be shifted in the direction perpendicular to the optical axis OX.

For example, the second element portion E20b located in the upper center region of the image sensor IM10 may be shifted in a direction −Y with respect to the first element portion E10b, and the second element portion E20c located in the lower center region thereof may be shifted in a direction +Y with respect to the first element portion E10c. The second element portion E20d located in the left center region of the image sensor IM10 may be shifted in a direction +X with respect to the first element portion E10d, and the second element portion E20e located in the right center region thereof may be shifted in a direction −X with respect to the first element portion E10e. The second element portion E20f located in the left upper region of the image sensor IM10 may be shifted in the direction +X and the direction −Y with respect to the first element portion E10f; the second element portion E20g located in the right upper region thereof may be shifted in the direction −X and the direction −Y with respect to the first element portion E10g; the second element portion E20h located in the left lower region thereof may be shifted in the direction +X and the direction +Y with respect to the first element portion E10h; and the second element portion E20i located in the right lower region thereof may be shifted in the direction −X and the direction +Y with respect to the first element portion E10i. In this manner, the second element portions E20b, E20c, E20d, E20e, E20f, E20g, E20h, and E20i of the color splitter elements disposed in the peripheral portion of the image sensor IM10 may be further shifted toward the center region of the image sensor IM10 in comparison with the first element portions E10b, E10c, E10d, E10e, E10f, E10g, E10h, and E10i corresponding thereto. Also, the first element portions E10b, E10c, E10d, E10e, E10f, E10g, E10h, and E10i and the second element portions E20b, E20c, E20d, E20e, E20f, E20g, E20h, and E20i may be shifted symmetrically with respect to the center region of the image sensor IM10. For example, the first element portions E10b, E10c, E10d, E10e, E10f, E10g, E10h, and E10i and the second element portions E20b, E20c, E20d, E20e, E20f, E20g, E20h, and E20i of the color splitter elements may be shifted to align with the traveling direction of the chief ray passing through the lens structure LS10 (see FIG. 1).

The color splitter structures according to various exemplary embodiments described above may be applied, for example, to image sensors. The image sensors may be, for example, complementary metal-oxide-semiconductor (CMOS) image sensors. The image sensor may include the color splitter structure and the pixel array including the pixels for detecting the lights passing out through the color splitter structure. The image sensors according to the exemplary embodiments may be applied to optical apparatuses such as image pickup apparatuses. The color splitter structures according to the various exemplary embodiments may be applied to various optical elements requiring color separation functions in addition to the image sensors, and may be applied to various other optical apparatuses such as display apparatuses in addition to the image pickup apparatuses.

Although many details have been described above, they are not intended to limit the scope of the inventive concept, but should be interpreted as examples of the exemplary embodiments. For example, those of ordinary skill in the art will understand that the configurations of the color splitter elements, the color splitter structures, the image sensors, and the optical apparatuses described with reference to FIGS. 1 to 4 and 8 to 14 may be variously modified. As an example, the element portions included in each color splitter element may have tetragonal or trapezoidal cross-sectional shapes or various other cross-sectional shapes, and the shapes thereof viewed from above may also be variously modified. Similarly, the shape of the etch stop layer may also be variously modified. In addition, the color splitter structure manufacturing methods described with reference to FIGS. 6A to 6G and 7A to 7H and the image sensor manufacturing methods using the same may also be variously modified. Therefore, the scope of the inventive concept should be defined not by the described exemplary embodiments but by the technical spirit and scope described in the appended claims.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the appended claims.

What is claimed is:

1. A color splitter comprising:
a plurality of color splitter elements configured to divide an incident light into a plurality of exit lights according to wavelengths,
wherein at least one of the color splitter elements comprises:
a first element portion;
a second element portion disposed to partially overlap with the first element portion; and
an etch stop layer formed of a material having a predetermined etch selectivity with regard to the first element portion or the second element portion, and disposed between the first element portion and the second element portion,
wherein a part of a surface of the etch stop layer is in direct contact with the second element portion and a rest of the surface of the etch stop layer is apart from the second element portion and in direct contact with a dielectric material; or a part of another surface of the etch stop layer is in direct contact with the first element portion and a rest of the other surface of the etch stop layer is apart from the first element portion and in direct contact with the dielectric material.

2. The color splitter of claim 1, wherein
the etch stop layer entirely covers a surface of the first element portion which faces the second element portion.

3. The color splitter of claim 1, wherein
the etch stop layer entirely covers a surface of the second element portion which faces the first element portion.

4. The color splitter of claim 1, wherein the predetermined selectivity of the material of the etch stop layer is about 1.5 or more with respect to the first element portion or the second element portion.

5. The color splitter of claim 1, wherein
at least one of the first and second element portions comprises an oxide material, and
the etch stop layer comprises a non-oxide material.

6. The color splitter of claim 1, wherein
the etch stop layer comprises a nitride material, and at least one of the first and second element portions comprises a non-nitride material.

7. The color splitter of claim 1, wherein
at least one of the first and second element portions comprises at least one of a titanium (Ti) oxide, a niobium (Nb) oxide, and a tantalum (Ta) oxide, and
the etch stop layer comprises a silicon (Si) nitride.

8. The color splitter of claim 1, wherein
at least one of the first and second element portions comprises a Si nitride, and
the etch stop layer comprises a Si oxide.

9. The color splitter of claim 1, further comprising a dielectric layer having the dielectric material,
wherein the color splitter elements are buried in the dielectric layer.

10. The color splitter of claim 1, wherein
a color splitter element disposed at a center portion of the plurality of color splitter elements comprises an aligned stack of first and second element portions which are stacked without misalignment along an optical axis, and
each of the color splitter elements disposed in a region other than the center portion of the plurality of color splitter elements comprises a misaligned stack of first and second element portions.

11. The color splitter of claim 10, wherein a misalignment distance between the first element portion and the second element portion increases in proportion to a distance away from the center portion.

12. The color splitter of claim 10, wherein the first element portion and the second element portion disposed in the region other than the center portion, are aligned with a traveling direction of an incident light that is obliquely incident thereon.

13. The color splitter of claim 1, wherein the at least one of the color splitter elements further comprises:
a third element portion overlapping partially with the second element portion; and
a second etch stop layer provided between the second element portion and the third element portion.

14. An image sensor comprising:
the at least one of the color splitter elements of claim 1; and
a pixel array comprising a plurality of pixels configured to detect a light passing out through the color splitter.

15. An optical apparatus comprising:
at least one lens; and
the image sensor of claim 14, the image sensor being configured to convert lights passing through the at least one lens into electrical image signals.

* * * * *